(12) United States Patent
Olsson

(10) Patent No.: US 11,988,510 B1
(45) Date of Patent: May 21, 2024

(54) SMART PAINT STICK DEVICES AND METHODS

(71) Applicant: SeeScan, Inc., San Diego, CA (US)

(72) Inventor: Mark S. Olsson, La Jolla, CA (US)

(73) Assignee: SeeScan, Inc., San Diego, CA (US)

( * ) Notice: Subject to any disclaimer, the term of this patent is extended or adjusted under 35 U.S.C. 154(b) by 0 days.

(21) Appl. No.: 17/529,444

(22) Filed: Nov. 18, 2021

Related U.S. Application Data

(63) Continuation of application No. 13/769,202, filed on Feb. 15, 2013, now Pat. No. 11,193,767.

(60) Provisional application No. 61/599,404, filed on Feb. 15, 2012.

(51) Int. Cl.
| | |
|---|---|
| *B05B 12/00* | (2018.01) |
| *B05B 12/04* | (2006.01) |
| *B05B 12/12* | (2006.01) |
| *B05B 15/62* | (2018.01) |
| *B65D 83/20* | (2006.01) |
| *G01C 15/04* | (2006.01) |
| *G01V 3/08* | (2006.01) |
| *G01V 3/15* | (2006.01) |
| *E01C 23/22* | (2006.01) |
| *G01R 29/08* | (2006.01) |

(52) U.S. Cl.
CPC ............ *G01C 15/04* (2013.01); *B05B 12/004* (2013.01); *B05B 12/04* (2013.01); *B05B 12/124* (2013.01); *B05B 15/62* (2018.02); *B65D 83/203* (2013.01); *G01V 3/08* (2013.01); *G01V 3/15* (2013.01); *E01C 23/227* (2013.01); *G01R 29/0892* (2013.01)

(58) Field of Classification Search
None
See application file for complete search history.

(56) References Cited

U.S. PATENT DOCUMENTS

| | | |
|---|---|---|
| 6,723,375 B2 | 4/2004 | Zeck et al. |
| 7,640,105 B2 | 12/2009 | Nielsen et al. |
| 8,118,192 B2 | 2/2012 | Daugherty |
| (Continued) | | |

OTHER PUBLICATIONS https://oceanservice.noaa.gov/education/tutorial_geodesy/geo09_gps.html (Year: 2023).*

(Continued)

*Primary Examiner* — Binu Thomas
(74) *Attorney, Agent, or Firm* — Steven C. Tietsworth, Esq.; Michael J. Pennington, Esq.

(57) ABSTRACT

Location systems and methods for locating paint and other markings on a surface are described. More specifically, but not exclusively, the disclosure relates to smart paint stick devices and methods of use in locating and marking buried utility lines or other buried objects. One system for locating a buried object may include a buried object locator and a paint stick. The locator may include a tracking component configured to detect a location of a buried object. The paint stick may be configured to cause a paint container to dispense paint at a first position associated with the location of the buried object. The paint stick may include a position determination component configured to transmit one or more range vector signals that are detected by the tracking component. Sensors may be used to determine when paint is dispensed from a paint container, and to determine a color of the paint or a type of a marking.

14 Claims, 28 Drawing Sheets

(56) References Cited

U.S. PATENT DOCUMENTS

| | | | |
|---|---|---|---|
| 8,361,543 | B2 | 1/2013 | Nielsen et al. |
| 8,374,789 | B2 | 2/2013 | Nielsen et al. |
| 2010/0006667 | A1* | 1/2010 | Nielsen .................. G01G 17/06 239/289 |
| 2010/0027288 | A1 | 2/2010 | Olsson et al. |
| 2010/0058983 | A1 | 3/2010 | Daugherty |
| 2010/0090700 | A1* | 4/2010 | Nielsen .................... G01V 3/15 324/329 |
| 2010/0141261 | A1* | 6/2010 | Overby .................... G01V 3/12 702/2 |
| 2010/0263591 | A1* | 10/2010 | Nielsen .................... B05D 1/02 118/712 |
| 2011/0006772 | A1* | 1/2011 | Olsson .................. G01R 19/00 324/326 |
| 2011/0045175 | A1 | 2/2011 | Nielsen et al. |
| 2012/0113244 | A1 | 5/2012 | Nielsen et al. |

OTHER PUBLICATIONS https://www.faa.gov/about/office_org/headquarters_offices/ato/service_units/techops/navservices/gnss/gps/howitworks (Year: 2023).*
https://www.nist.gov/how-do-you-measure-it/how-do-you-measure-your-location-using-gps#:~:text=The%20GPS%20receiver%20in%20your,your%20longitude%2C%20latitude%20and%20altitude. (Year: 2023).*

* cited by examiner

SMART PAINT STICK DEVICES AND METHODS

CROSS-REFERENCE TO RELATED APPLICATIONS

This application is a continuation of and claims priority to U.S. patent application Ser. No. 13/769,202, entitled SMART PAINT STICK DEVICES AND METHODS, filed Feb. 15, 2013, which claims priority to U.S. Provisional Patent Application Ser. No. 61/599,404, entitled SMART PAINT STICK DEVICES AND METHODS, filed Feb. 15, 2012. The content of each of these applications is incorporated by reference herein in its entirety for all purposes.

FIELD

This disclosure relates generally to paint stick devices for applying markings to the ground or other surfaces. More specifically, but not exclusively, the disclosure relates to smart paint stick devices and methods of use in locating and marking buried utility lines or other buried objects.

BACKGROUND

Paint stick devices for marking buried utility lines are known in the art. These paint stick devices are often employed in industrial or construction sites to create a paint mark indicating locations of interest when locating buried utilities or other buried objects.

Conventional paint stick devices, however, leave much room for improvement. Current paint stick devices generally rely upon the person or persons utilizing the paint marks to physically rediscover the location of the paint mark and be able to accurately interpret the meaning. Solutions that have attempted to aid in making this process both safer and more reliable have fallen short of doing so.

Accordingly, there is a need for improved paint stick devices with enhanced functionality to address the above described as well as other problems.

SUMMARY

In accordance with various aspects of this disclosure, a smart paint stick device may include a central shaft like body equipped with one or more sensors, signal transmitters and other components, allowing a base element, such as a handheld portable utility locating device, to determine the approximate position of a paint mark when paint is applied. Activation of the one or more sensors, transmitters, and other components of the smart paint stick device may occur simultaneous with spraying of a paint mark. The sensors, transmitters, and other devices may include, but are not limited to, sondes, including single or multi-axis sondes, wireless communication pathways, GPS, accelerometers, gyroscope sensors, optical and imaging sensors (e.g., cameras), inertial sensors, and/or other components.

In accordance with one aspect, a system for locating a buried object may include a buried object locator and a paint stick. The locator may include a first communication component, and a tracking component configured to detect a location of a buried object. The paint stick may be configured to cause a paint container to dispense paint at a first position associated with the location of the buried object. The paint stick may include a second communication component configured to communicate with the first communication component of the locator, and a position determination component configured to transmit one or more range vector signals describing distance and/or direction. The tracking component may be further configured to detect the one or more range vector signals. Additional components may include sensors configured to determine when paint is dispensed from the paint container, including acoustic sensors or magnetic sensors. Additional components may include sensors configured to determine a color of the paint or a type of a marking.

In accordance with another aspect, specific paint marks may be translated through the use, for instance, of cameras and optical character recognition technology (OCR), position determination using one or more sondes and electromagnetic sensors of a nearby locator, and/or by utilizing motion sensors to determine the particular motion of the paint stick when activated.

Various additional aspects, features, and functions are described below in conjunction with the appended Drawings.

BRIEF DESCRIPTION OF THE DRAWINGS

The present application may be more fully appreciated in connection with the following detailed description taken in conjunction with the accompanying drawings, wherein.

DETAILED DESCRIPTION

Various aspects, details, and functions as disclosed subsequently herein may be used in combination with the disclosures of co-assigned patent applications including U.S. patent application Ser. No. 12/827,993, U.S. patent application Ser. No. 11/782,572, U.S. patent application Ser. No. 13/766,670, and U.S. patent application Ser. No. 13/161,183. The content of each of these applications is incorporated by reference herein in its entirety. Various aspects, details, and functions as disclosed subsequently herein may be used in combination with the disclosures of U.S. Publication Nos. 2010/00263591, 2010/00272885, 2010/0058983, 2011/0045175, and 2012/00113244. The content of each of these publications is incorporated by reference herein in its entirety. Various aspects, details, and functions as disclosed subsequently herein may be used in combination with the disclosures of U.S. Pat. Nos. 6,723,375, 7,640,105 and 8,118,192. The content of each of these patents is incorporated by reference herein in its entirety.

Aspects, Features & Functions

Figure 1:
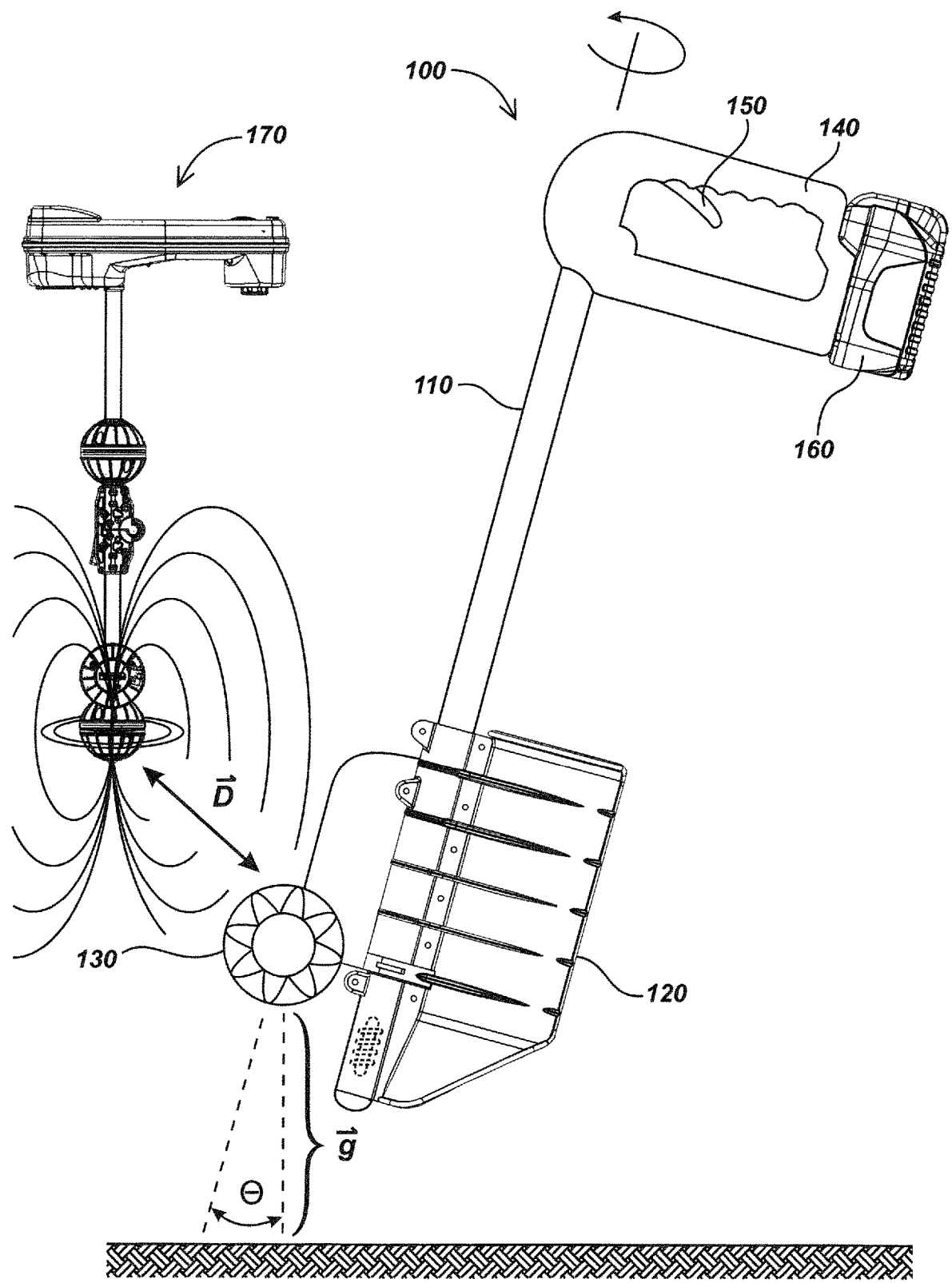
FIG. 1 is a side view of an embodiment of a smart paint stick device.

This disclosure relates generally to paint stick devices used to mark buried utility lines. More specifically, but not exclusively, the disclosure relates to smart paint stick devices whereby information associated with the location of a paint mark created by a smart paint stick may be communicated to, processed, stored and/or transmitted by a base element, such as a portable buried utility locator device, or other device or system. A processing element of the smart paint stick may be configured to process data, images, control signals, or other data or information associated with triggers, beacons, cameras or other image sensing elements, or other components of the smart paint stick. As used herein, the terms sonde, single or multi-axis sonde, array of sondes, or array of single or multi-axis sondes refer to signal transmitters, such as a magnetic dipole transmitter having a characteristic or modulated frequency and phase, that actively or passively transmit a signal to a base unit, such as a utility locating device, such as portable utility locator device 170 as shown in FIG. 1.

For example, in one aspect, a system for locating a buried object includes a buried object locator and a paint stick. The locator includes: a first communication component; and a tracking component configured to detect a location of a buried object. The paint stick includes: a paint receptacle configured to cause a paint container to dispense paint at a first position associated with the location of the buried object; a second communication component configured to communicate with the first communication component of the locator; and a position determination component configured to transmit one or more range vector signals, wherein the tracking component may be further configured to detect the one or more range vector signals.

In another aspect, the second communication component and the position determination component are the same component. For example, references to either and both components refer to a sonde dipole. In this manner, the sonde is used to track position and also communicate data or status (e.g., paint is dispensing) via any known modulation means such as FSK, PSK, and others.

In another aspect, the system for locating a buried object further includes: a processing component operable to determine the first position based on the detected range vector signals. The processing component may be operable to determine a distance between the buried object locator and the paint stick in three-dimensional space based on the one or more range vector signals, and to determine the first position based on the distance. The paint stick may include an inertial sensor configured to determine a first tilt angle of the paint stick in three-dimensional space, the first communication component may be configured to receive information specifying the first tilt angle, and the processing component may determine the first position based on the detected range vector signals and the first tilt angle. The position determination component may include at least one sonde, and the tracking component may include at least one electromagnetic sensor. The system may include a position device to determine a second position of the locator, and a processing component operable to determine the first position based on the second position determined by the position device.

In another aspect, the system may include: a screen configured to display information relating to the first position of the dispensed paint. The screen may be configured to display the first position and the location of the buried object, to display the first position of and a tolerance zone associated with the buried object, and/or to display a type of the buried object. The system may include: a processor operable to identify a first type of buried object associated with a detected color of the dispensed paint, and further operable to identify a second type of buried object associated with the buried object, and the screen may be configured to display an indication that the first type and the second type do not match. The screen may be configured to indicate a type of marking associated with the first position from among types of markings selected from the group consisting of a line of paint on a surface, a dot of paint on the surface, a flag attached to the surface, and a whisker positioned on or above the surface.

In another aspect, the system may include: a detection component configured to detect when the paint container dispenses the paint at the first position. The position determination component may be configured to transmit the one or more range vector signals upon detection, by the detection component, that the paint container may be dispensing the paint. The detection component may include an acoustic sensor configured to detect when the paint container dispenses the paint by identifying a first frequency, from among other frequencies, associated with a sound of the paint dispensing from the paint container. The paint container may include an exit nozzle where paint exits when the paint may be applied to the first position. The acoustic sensor may be located closer to the exit nozzle than a base of the paint container. The acoustic sensor may alternatively be located closer to a base of the paint container than the exit nozzle. The paint stick may include: an actuation component configured to activate an exit nozzle of the paint container thereby causing the paint container to dispense the paint, and the detection component may include an actuation sensor configured to detect when the actuation component actuates. The actuation sensor may include a magnetic sensor configured to sense a change in the magnetic field of a magnet attached to the actuating component as the actuating component moves. The detection component comprises: a motion sensor configured to detect when the paint container dispenses the paint by detection motion of the paint.

In another aspect, the system may include: a determination component configured to determine a color of the paint. The determination component may include an image sensor configured to determine the color of the paint by sensing the color on the paint container. The determination component may include an image sensor configured to determine the color of the paint by sensing the color of the dispensed paint on a surface at the first position. The determination component comprises an image sensor configured to determine the color of the paint by scanning a code attached to or printed on the paint container. The color of the paint may be associated with a type of buried object selected from the group consisting of a communication line, a gas line, and a sewer line. The determination component may include an input component configured to receive user input regarding the color of the paint, wherein the input component includes a dial, a button, or a screen. The determination component may include a magnetic sensor associated with the paint container.

In another aspect, the second communication component includes an RFID component configured to transmit data relating to a color of the paint. The RFID component may be a passive RFID component. The second communication component may include a wireless transmission component configured to transmit data relating to a color of the paint.

In another aspect, the system may include: a power source coupled to the paint stick; and a power control component configured to activate or deactivate the power source. The power control component may include an inertial sensor configured to detect whether the longest dimension of the paint stick may be oriented at a substantially horizontal orientation, and the power control component may be configured to deactivate the power source when the longest dimension of the elongate support structure may be oriented at the substantially horizontal orientation of less than 30 degrees from a plane perpendicular to a gravity vector. The power control component may include an inertial sensor configured to detect whether the longest dimension of the paint stick may be oriented at a generally vertical orientation, and the power control component may be configured to activate the power source when the longest dimension of the elongate support structure may be oriented at the generally vertical orientation of less than 60 degrees from the gravity vector. The power control component may include a timer configured to deactivate the power source after a predefined time of inactivity.

In another aspect, the system may include: a detection component configured to detect when the paint container dispenses the paint at the first position; a determination component configured to determine a color of the paint; and an enclosure configured to enclose the detection component and the determination component, wherein the enclosure may be coupled to the bottom of the paint container. The enclosure may be magnetically coupled to the bottom of the paint container. The enclosure may be configured to snap onto the bottom of the paint container. The enclosure may be coupled to the paint stick above the paint container, and the enclosure may be configured to enclose a power source and at least part of the detection component. The enclosure may be coupled to the paint stick above the paint container, and the enclosure may be configured to enclose a power source and at least part of the detection component.

For example, in one aspect, the disclosure relates to a smart paint stick device. The smart paint stick device may include an elongated support element, such as a shaft element, as well as a paint receptacle element, a handle with a trigger or button, a battery, and a beacon element for communicating with a separate base element or elements such as a hand held utility locator enabled to work with the smart paint stick device.

In another aspect, the disclosure relates to a method whereby the beacon element may communicate data, including location information, with a base element or other device of system. The method may include a stage whereby pulling the trigger on the smart paint stick device may simultaneously activate the beacon element while spraying a paint mark. The method may further include the base element being instructed to wake up upon the activation of the beacon element. Another stage may include the base element recording and interpreting data communicated by the beacon element to determine location of the paint mark.

In another aspect, the beacon element may include one or more dipole transmitters for position tracking and/or data transmission. In alternative embodiments, other technologies may be utilized to wirelessly communicate data and/or location such, as ISM radio devices or modules, licensed spectrum radio devices or modules, passive and active RFID transmitters, Bluetooth or Wi-Fi modules, cellular devices or modules, GPS devices or modules, or other devices or modules. Transmission of the beacon element or other wireless communication technologies (e.g., RFID) may be configured to occur when an actuation component (e.g., a trigger) of a paint stick is actuated or when paint dispensing is sensed. Position data, along with color data may be transmitted to a nearby locator at any time, including upon actuation of the actuation component.

In another aspect, the disclosure relates to a paint receptacle element designed to accommodate multiple cans of paint. In such embodiments, a paint selector switch or dial may be used to allow the operator to select paints and/or information associated with a paint being used, such as a desired paint color or type, without having to physically replace the paint can.

In another aspect, a battery used in the smart paint stick device may be a specialized battery. In alternative embodiments, the smart paint stick device may also be configured to operate using commercially available batteries such as C cell or D cell batteries, 6 or 12 volt batteries, or other commercially available batteries.

In another aspect, sensors or sensors may be used to further refine location information. For example, accelerometers or gyroscope sensors, inertial sensors, compass sensors, gas sensors (e.g., to detect gas leaks) or other sensors or devices may be used to determine the angle by which the smart paint stick device is being held, allowing calculations to be made to better approximate the location of where the paint mark has been sprayed.

In another aspect, optical sensors may be used to sense information about the color or other characteristics of paints being used. This information may be used to interpret the color of the paint mark sprayed on the ground, and/or to identify the type of surface the paint mark is being sprayed on.

In another aspect, sensors such as accelerometers or gyroscope sensors may be used to determine movement of the smart paint stick device while the trigger is being actuated. By determining movement of the smart paint stick device while the trigger is being pulled, characters or other information being written in paint may be determined. For instance, if the operator creates a paint mark stating "gas", the sensors may be used to interpret the characters and indicate the mark as gas.

In another aspect, a camera or other optical sensing element may be used in a smart paint stick to record paint marks. Optical character recognition may be used in conjunction with captured images or other data or information associated with the paint mark to extract information about the paint mark.

In another aspect, a smart paint stick may include a time tracking element, such as a GPS module or other time reference device, that may be used to match data collected over time, with the data and time information stored upon computer readable media such as a commercially available USB thumb drive. Information may later be transferred to a base element in place of or in addition to being communicated through wireless devices in real-time.

In another aspect, a method for encoding containers that hold paint, such as paint canisters, may use magnetizing patterns or attached materials with magnetized patterns on the paint container or canister to retrieve information associated with paint being dispensed.

In yet another aspect, a system for marking locations of buried objects, may include: a detection unit configured to detect when a first mark may be applied to a first area of a surface; a determination unit configured to determine a type of the first mark; and a communication component configured to communicate information relating to the first mark.

In another aspect, the detection unit may include: an acoustic sensor configured to detect when the first mark may be applied to the first area of the surface by determining whether paint may be dispensing from a paint container. The acoustic sensor may be configured to determining whether the paint may be dispensing from the paint container by identifying a first frequency, from among other frequencies, associated with a sound of the paint exiting the paint container. The acoustic sensor may be located closer to a bottom of the paint container than a nozzle of the paint container, wherein the paint exits via the nozzle. The acoustic sensor may be located closer to a nozzle of the paint container than a bottom of the paint container, wherein the paint exits via the nozzle. The detection unit may include an actuation sensor configured to detect when a nozzle of a paint container may be activated. The actuation sensor may be configured to determine when an actuating component of a paint stick causes the nozzle of the paint container to activate. The actuation sensor may include a magnetic sensor, wherein at least part of the magnetic sensor may be attached to the actuating component. The actuation sensor may include a pressure sensor attached to the actuating component. The actuation sensor may include a pressure sensor attached to the actuating component. The detection unit may include: a motion sensor configured to detect when the first mark may be applied to the first area of the surface by determining whether paint may be dispensing from a nozzle of a paint container. The first mark may be a paint mark. The first mark may be a virtual mark relating to at least one pair of coordinates associated with the first area of the surface.

In another aspect, the determination unit may include: an image sensor configured to determine a color of paint. The color of paint may be a color on a paint container. The color of paint may be a color of the first mark on the surface. The image sensor includes a code reader configured to scan a code attached to or printed on a paint container. The color of paint may be associated with a type of buried object selected from the group consisting of a communication line, a gas line, and a sewer line. The determination unit may include: a selector configured to receive user input regarding a color of the first mark applied to the surface, wherein the selector includes a dial, a slider, a button, or a screen. The determination unit may include: a selector configured to receive user input regarding a type of the first mark applied to the surface, wherein the selector includes a dial, a slider, a button, or a screen, and wherein the type of the first mark may be a communication line, a gas line, or a sewer line. The determination unit may include: a magnetic sensor configured to identify a color of a paint container.

In another aspect, the communication component includes an RFID component. The RFID component may be a passive RFID component. In another aspect, the communication component includes a wireless transmission component. The wireless transmission component may be configured to transmit data using Bluetooth. The communication component may be configured to transmit information indicating the type of the first mark. The communication component may be configured to transmit information indicating the whether the first mark may be being applied to the surface. The communication component may be configured to transmit information indicating the location of the first mark on the surface.

In another aspect, the system of may include: an elongate support structure; a paint receptacle configured to hold a paint container; and an actuating component configured to cause paint to dispense from the paint container.

In another aspect, the system may include a processing component operable to estimate a location of the first area of the surface where the first mark may be applied. The system may include: a portable buried object locator configured to detect and measure one or more signals from a relative position of the first mark. The system may include: one or more location components configured to measure information relating to a relative position of the first area of the first mark. The system may include: an elongate support structure coupled to a paint receptacle configured to hold a paint container; and one or more location components configured to measure information relating to a first tilt angle of the elongate support structure with respect to the surface, wherein the estimated location of the first area may be based on the first tilt angle. The one or more location components may be configured to measure information relating to the first tilt angle with respect to a first vertical plane that may be substantially perpendicular to the surface. The one or more location components may be further configured to measure information relating to a second tilt angle of the elongate support structure with respect to a second vertical plane that may be substantially perpendicular to the surface and substantially perpendicular to the first vertical plane, wherein the estimated location of the first area may be based on the second tilt angle. The one or more location components include an inertial sensor configured to determine the first tilt angle. The system may include: an elongate support structure coupled to a paint receptacle configured to hold a paint container; and one or more location components configured to measure information relating to a second distance between the elongate support structure and a portable buried object locator, wherein the estimated location of the first area may be based on the second distance. The first location component may include a sonde. The system may include: an elongate support structure coupled to a paint receptacle configured to hold a paint container; and one or more location components configured to measure information relating to a first distance between one feature of the a first location component of the one or more location components and the surface, wherein the estimated location of the first area may be based on the first distance. The first location component may include a sonde. The system may include: an elongate support structure coupled to a paint receptacle configured to hold a paint container; and one or more location components configured to measure information relating to a movement of the elongate support structure with respect to the surface, wherein the estimated location of the first area may be based on the movement. The one or more location components may include an inertial sensor configured to determine the movement. The system may include one or more location components configured to: measure information relating to a first tilt angle of the elongate support structure with respect to the surface; measure information relating to a first distance between one feature of the a first location component of the one or more location components and the surface; and measure information relating to a second distance between the elongate support structure and a portable buried object locator, wherein the estimated location of the first area may be based on the first tilt angle, the first distance, and the second distance.

In another aspect, the system may include a power control component configured to conserve a power source's power. The system may include: an elongate support structure coupled to a paint receptacle configured to hold a paint container; and an inertial sensor configured to detect whether the longest dimension of the elongate support structure may be oriented at a first orientation, wherein the power control component may be configured to prevent the detection unit and the determination unit from drawing power from the power source when the longest dimension of the elongate support structure may be oriented at the first orientation. The first orientation may be generally horizontal. The system may include: an elongate support structure coupled to a paint receptacle configured to hold a paint container; and an inertial sensor configured to detect whether the longest dimension of the elongate support structure may be oriented at a second orientation, wherein the power control component may be configured to permit the detection unit and the determination unit to draw power from the power source when the longest dimension of the elongate support structure may be oriented at the second orientation. The second orientation may be substantially vertical. The power control component includes a timer.

In another aspect, the system may include a screen configured to display information relating to the first area of the surface. The screen may be configured to display representations of the first mark, a second mark, and a third mark, wherein the first mark may be associated with an application of paint on the surface, the second mark may be associated with a flag attached to the surface, and the third mark may be associated with a whisker positioned on or above the surface. The screen may be configured to display the location of the first area. The screen may be configured to display the determined type of the first mark, wherein the type of the first mark may be selected from the group consisting of a communication line, a sewer line, and a gas line. The screen may be configured to display a location of a first buried object, and a type of the first buried object selected from the group consisting of a communication line, a sewer line, and a gas line. The screen may be configured to display a location of a first buried object, a first tolerance boundary on a first side of the first buried object, and a second tolerance boundary on a second side of the first buried object.

In another aspect, the system may include a screen configured to display information relating to the first area of the surface, and a processing unit operable to: compare the determined type of the first mark to a detected type of a first buried object; and transmit, when the determined type of the first mark does not match the identified type of the first buried object, a signal specifying that the determined type of the first mark does not match the identified type of the utility, wherein the signal causes the screen to display an indication that the determined type of the first mark does not match the identified type of the utility.

In another aspect, the system may include a screen configured to display information relating to the first area of the surface, and a processing unit operable to: cause the screen to display the location of the first area, a location of a first buried object, and a tolerance zone associated with the first buried object.

In another aspect, the system may include a screen configured to display information relating to the first area of the surface, and a processing unit operable to: compare the location of the first area with a tolerance zone associated with a first buried object; and transmit, when the location of the first area does not fall within the tolerance zone associated with the first buried object, a signal specifying that the first area does not fall within the tolerance zone associated with the first buried object, wherein the signal causes the screen to display an indication that the first area does not fall within the tolerance zone associated with the first buried object Additional Aspects, Features & Functions Various additional aspects, features, and functions are described below in conjunction with FIGS. 1 through 27 of the appended Drawings.

It is noted that as used herein, the term, "exemplary" means "serving as an example, instance, or illustration." Any aspect, detail, function, implementation, and/or embodiment described herein as "exemplary" is not necessarily to be construed as preferred or advantageous over other aspects and/or embodiments.

Turning to FIG. 1, various details of one embodiment of a smart paint stick device 100 in accordance with aspects of the present disclosure are illustrated. The smart paint stick device embodiment 100 may include an elongated support structure, such as central shaft 110. A paint receptacle 120 may be positioned along the bottom end of the central shaft 110 to hold paint or paint containers, such as paint cans. As shown in FIG. 1, the paint receptacle 120 may be configured to hold spray paint cans. However, in alternative embodiments, paint receptacles may also be designed to accommodate other mechanisms for holding paint in order to create paint marks, such as paint pouches or paint compressors or include reservoirs for holding paint directly therein.

The paint receptacle 120 may also include sensors or other elements such as compass sensors, inertial navigation sensors, and/or RFID readers to interpret information encoded in the specific paint container or otherwise associated with the paint being used. Some example methods of encoding paint canisters and containers are described subsequently herein.

A beacon element, such as the single or multi-axis sonde 130, may be located above the paint receptacle 120, and may be coupled to the central shaft, such as along the central shaft 110 as shown. The beacon element may include a plurality of sondes or other transmitting devices configured in an array.

A handle 140, which may include or be coupled to a trigger 150 and/or a battery 160, may be included in the paint stick, such as by being located at or near a top end of the central shaft 110. As used herein, the terms sonde, single or multi-axis sonde, array of sondes, or array of single or multi-axis sondes refer to signal transmitters, such as a dipole transmitter, that transmits a signal to a base unit, such as a utility locating device, such as portable utility locator device 170 as shown in FIG. 1. This signal may be used to determine relative position of the sonde, single or multi-axis sonde, or arrays thereof to the base unit or other device.

The battery 160 may be selected and configured to control and/or power the single or multi-axis sonde 130 such that when a user activates the trigger 150, paint may be sprayed and a signal or signals may be generated by the single or multi-axis sonde 130 simultaneously.

The beacon element and/or other elements of the paint stick device may further include additional electrical components and sensors, such as, for example, accelerometers and gyroscope sensors (not illustrated in FIG. 1) as well as wired or wireless communication devices or modules to communicate data to a base element or other device or system. Such sensors may be used in conjunction with the single or multi-axis sonde 130 of the smart paint stick device 100 to form a virtual vertical sonde as is further described subsequently below.

The base element, such as portable utility locator device 170, may be configured to detect and measure signals from the relative position of the paint mark. This measurement is indicated by and referred to herein as D.

In embodiment 100, a virtual vertical sonde may be formed whereby an inertial navigation system, which may include but is not limited to three axis accelerometers and gyroscope sensors, may be used to determine Θ, the angle the smart paint stick device 100 is being tilted (e.g., relative to an upright position), and thereby determine the vertical orientation, denoted herein as $\downarrow \overline{g}$. Using $\downarrow \overline{g}$, the smart paint stick device 100 may adjust the phasing drive to always electronically steer the single or multi-axis sonde 130 vertical if using three coils. Processing as may be done in a smart paint stick devices such as device embodiment 100 or other smart paint stick device embodiments described herein may be implemented in a processing element of the smart paint stick (not shown).

Figure 2:
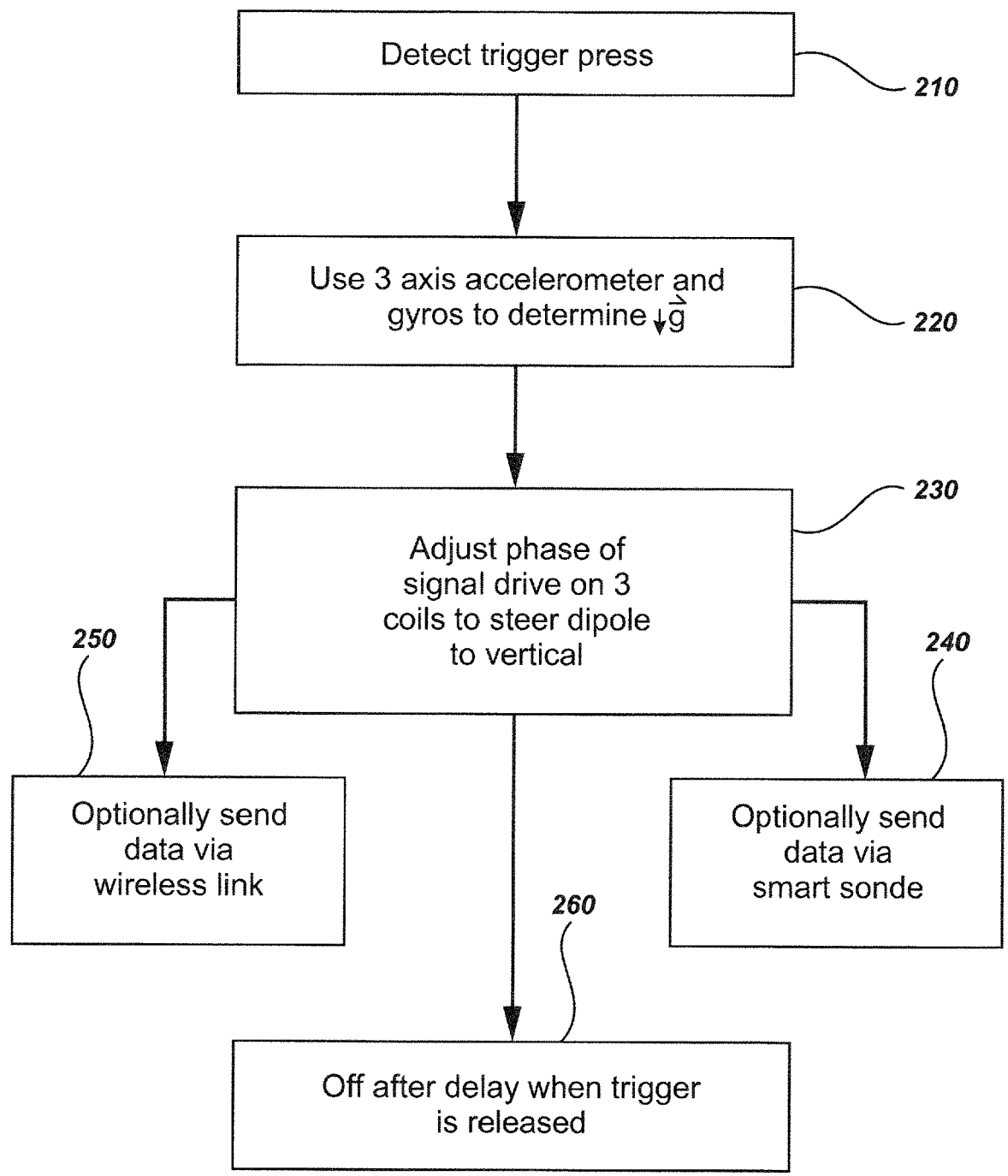
FIG. 2 is a block diagram describing an embodiment of a method of operation of a smart paint stick device.

FIG. 2 illustrates details of an embodiment of a process for operating a smart paint stick device, such as device 100 as shown in FIG. 1. During operation, a user may press a trigger of the smart paint stick device to mark a surface with paint. At stage 210, the trigger press may be detected and, at stage 220, a three axis accelerometer and/or gyro determine $f\overline{g}$. At stage 230, the signal drive on three coils of the beacon may be adjusted to steer a dipole to vertical. Optionally, at stage 240, data may be sent via a wireless transmitter device or module. Alternately, or in addition, at stage 250 data may be sent by a smart data transmitting sonde. At stage 260, the paint stick device elements may be turned off, for example after a predefined delay period, once the trigger has been released.

Figure 3:
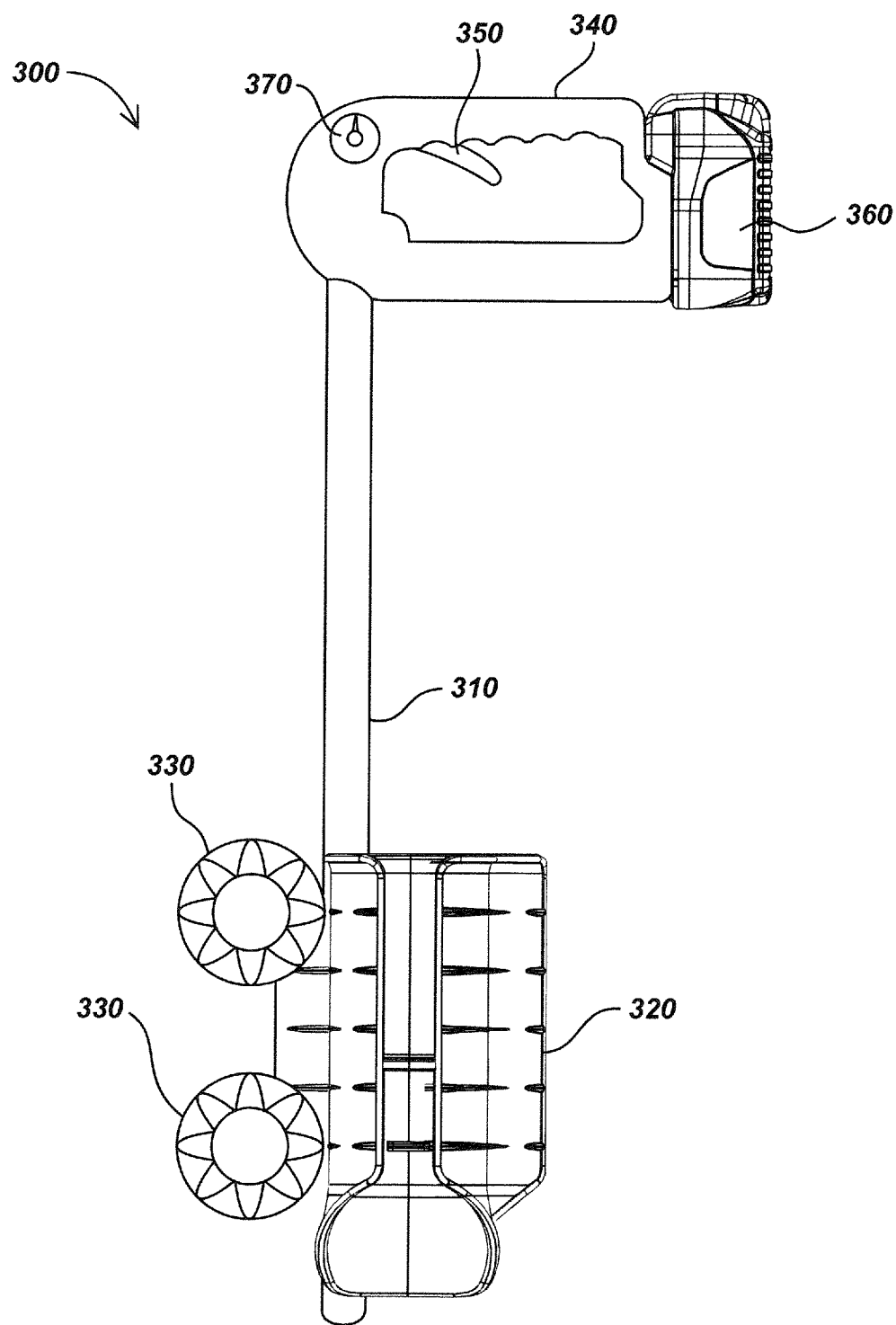
FIG. 3 is a side view of another embodiment of a smart paint stick device.

FIG. 3 illustrates another embodiment 300 of a smart paint stick device. Smart paint stick device embodiment 300 may include a central shaft 310 with a paint receptacle 320, which may be configured to hold multiple paint cans and may be positioned along or near the bottom end of the central shaft 310. In FIG. 3, the paint receptacle 320, as illustrated, is designed to accommodate paint canisters. In alternative embodiments the paint receptacle may also be designed to accommodate other mechanisms for holding paint to create paint marks, such as paint pouches or compressors.

The paint receptacle 320 and/or other enclosures/attachments may also include sensors such as compass sensors or RFID readers to interpret information encoded on or in the specific paint container or otherwise associated with the paint being used. Example methods of encoding paint canisters and containers are discussed subsequently herein. A beacon element, such as the array of single or multi-axis sondes 330, may be located above the paint receptacle 320 along or coupled to the central shaft 310.

A handle 340, which may include a trigger 350, a battery 360, and/or a paint-selector dial 370, may be located the top end of the central shaft 310. The paint-selector dial 370 may be configured to indicate the color installed and/or allow a user to physically select a desired color or type of paint stored within the paint receptacle 320. In alternative embodiments, a portable utility locator device may be configured to select the color, either automatically or manually.

The battery 360 may be configured to power the array of single or multi-axis sondes 330 such that when a user activates the trigger 350, paint may be sprayed and a signal generated by the single or multi-axis sonde 330, which may be done simultaneously with paint deployment. In some embodiments, the beacon element and/or other elements of the smart paint stick device may further include additional components and sensors, such as accelerometers and gyroscope sensors that are not illustrated. Such sensors may be used in conjunction with the array of single or multi-axis sondes 330 of the smart paint stick device 300 to further refine location data of the paint mark locations. In yet other embodiments, other technologies such as, but not limited to wired or wireless transmitter and receiver modules or devices may be used to communicate data with a base element or other device or system.

Figure 4:
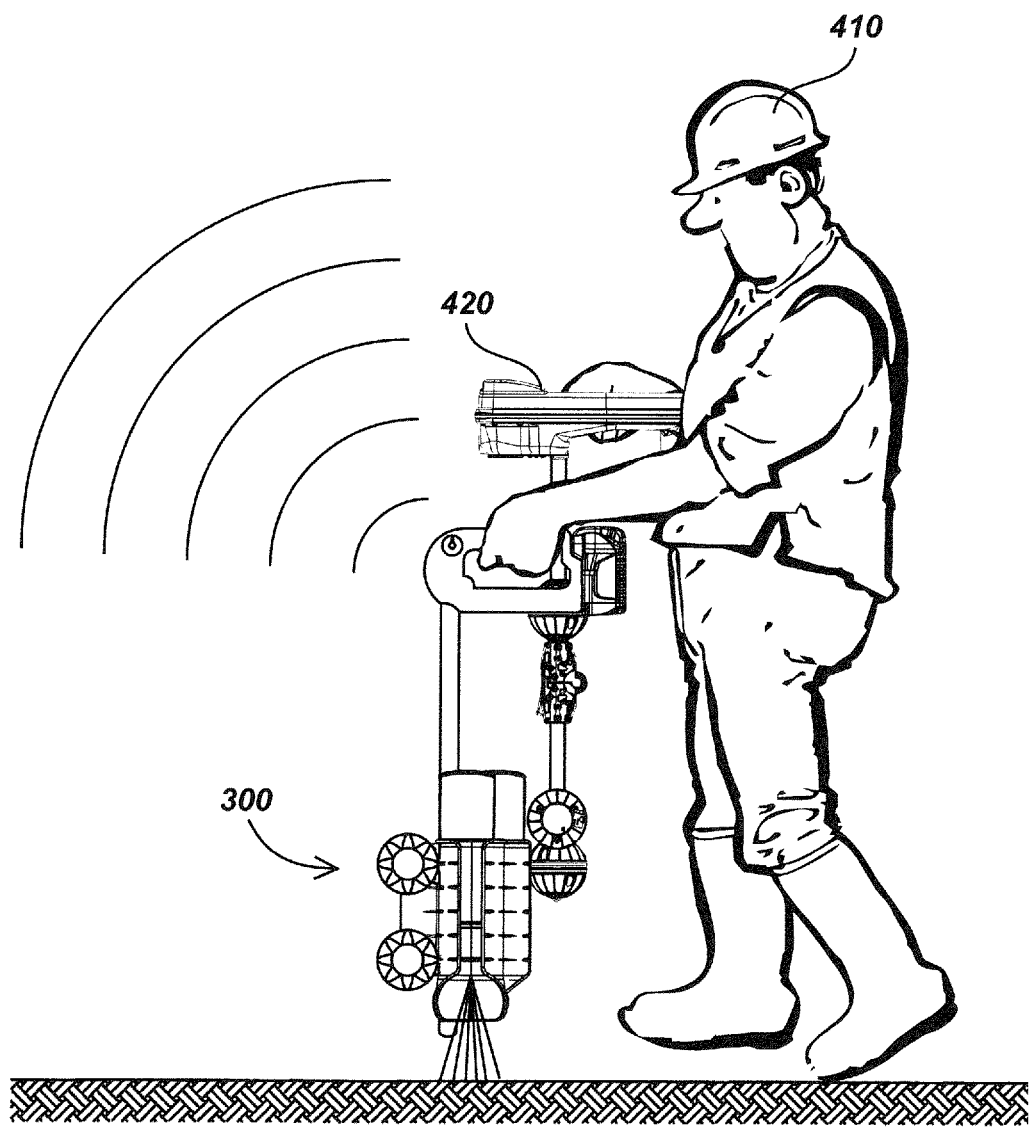
FIG. 4 is an illustration of the smart paint stick embodiment of FIG. 3 in use.

FIG. 4 illustrates an example use of an embodiment of a smart paint stick device such as device 300. When a user 410 activates the smart paint stick device by pulling a trigger, such as trigger 350 as illustrated in FIG. 3, paint is sprayed and electromagnetic signals generated, typically simultaneously, that can then be used to indicate the location of the paint mark. The signal may be wirelessly communicated to a base element, such as the utility locator device 420, which may be configured to receive, interpret, and store the generated signal and/or related data or information.

Figure 5:
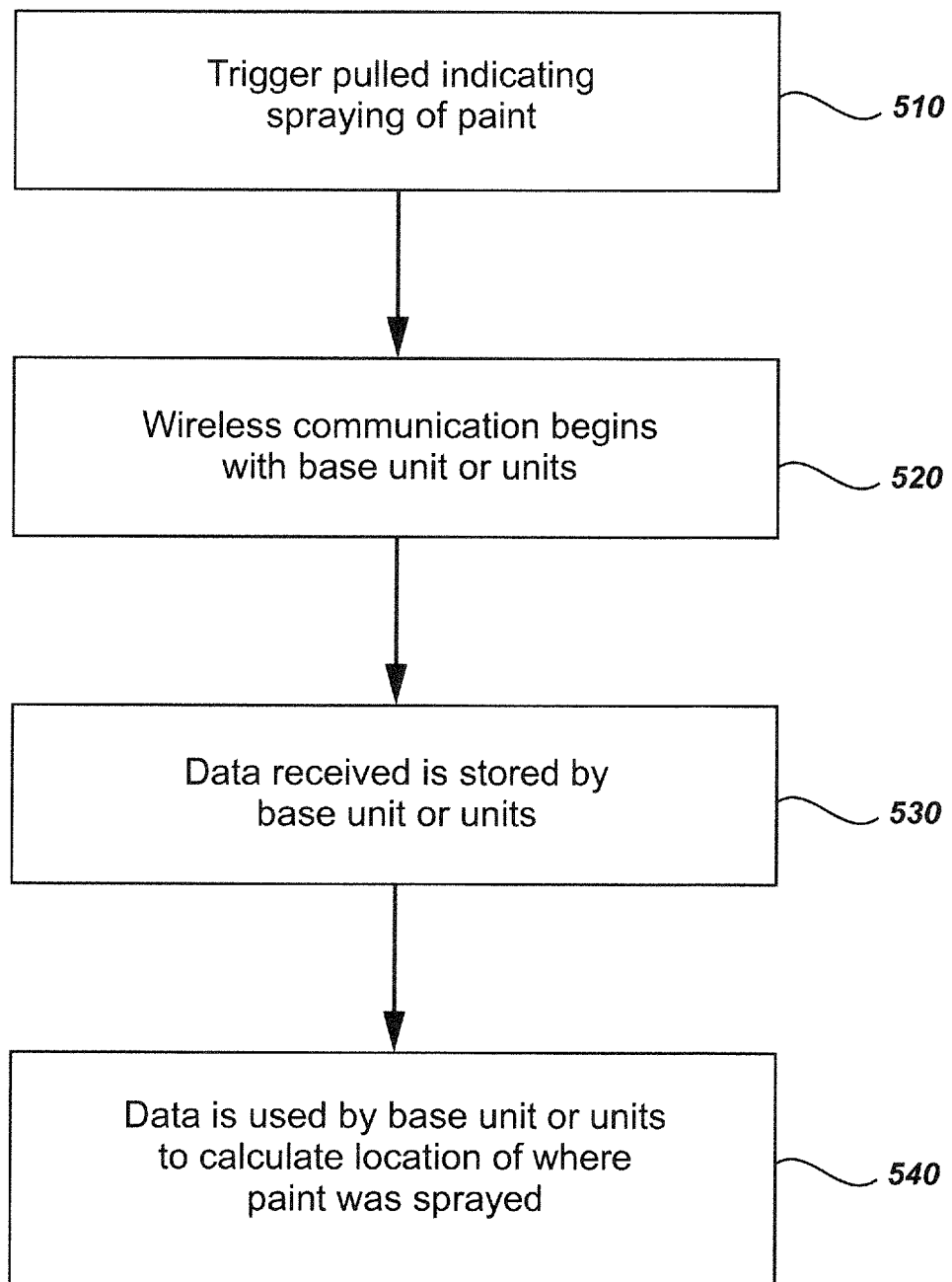
FIG. 5 is a block diagram illustrating an embodiment of a method of operation of a smart paint stick device.

Turning to FIG. 5, details of an embodiment of a process for operating a smart paint stick device, such as devices 100 or 300, are shown. At stage 510 an operator actuates a trigger which may then be sensed by sensing components of the smart paint stick device, such as switch sensors or other electrical or mechanical sensors. At stage 520, a wireless signal may be generated in conjunction with trigger actuator, typically simultaneously. At approximately the same time or within an associated time interval, paint may be deployed, such as by actuating a spray can trigger or otherwise deploying paint from the paint storage receptacle.

The base element, such as a portable utility locator device or other device or system, may be actuated or may be actively monitoring signals from the paint stick. At stage 530, data may be received and stored at the base element or other device or system. At stage 540, the received data may be processed at the base element, such as in a processing element, to determine an estimation of the location of the paint mark.

Figure 6:
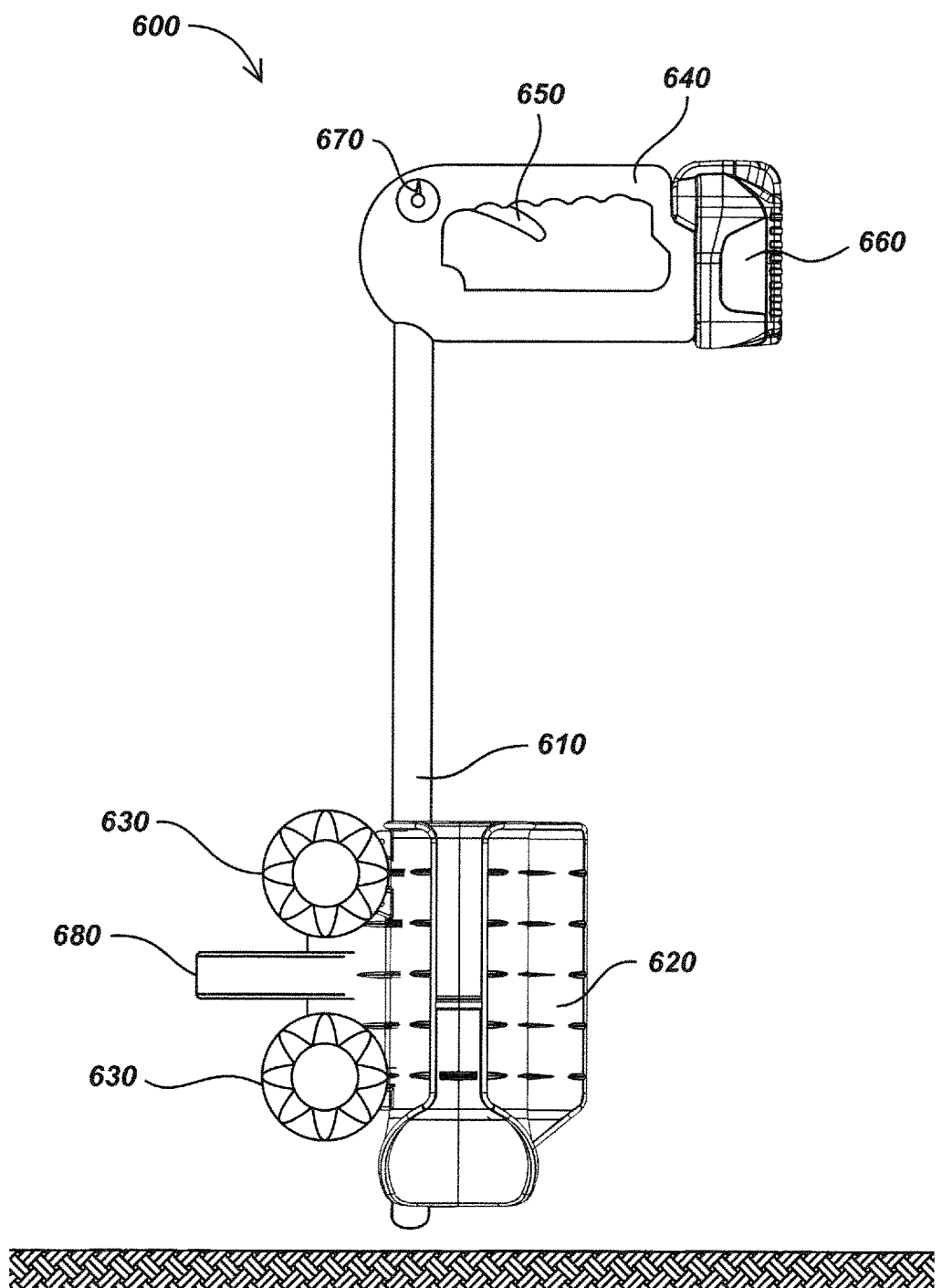
FIG. 6 is a side view of an embodiment of a smart paint stick device with optical sensors.

FIG. 6 illustrates details of another embodiment 600 of a smart paint stick device. Embodiment 600 may include a central shaft 610, a paint receptacle 620, which may be configured to hold multiple paint cans. Paint receptacle 620 may be mounted near or along the bottom end of the central shaft 610. In FIG. 6, the paint receptacle 620, as illustrated, is designed to accommodate paint canisters. In alternative embodiments the paint receptacle may be designed to accommodate other mechanisms of holding paint to create paint marks, such as paint pouches, compressors or other paint storage mechanism.

The paint receptacle 620 may also include sensors such as compass sensors or RFID readers to interpret information encoded in the specific paint container. Methods of encoding paint canisters and containers are discussed subsequently herein.

A beacon element, such as the array of single or multi-axis sondes 630, may be located above the paint receptacle 620 along the central shaft 610. A handle 640 with a trigger 650, a battery 660, and a paint-selector dial 670 may be located the top end of the central shaft 610. The paint-selector dial 670 may be enabled to allow the user to physical select the desired color or type of paint stored within the paint receptacle 620. In alternative embodiments, an enabled portable utility locator device may be configured with switches, sensors, or other components to select a paint color either automatically or manually.

The battery 660 may be configured to power the array of single or multi-axis sondes 630 such that when a user activates the trigger 650, paint may be sprayed and signal is generated by the array of single or multi-axis sondes 630 simultaneously. In some embodiments, the beacon element may further include additional components and sensors, such as accelerometers and gyroscope sensors that are not illustrated in FIG. 6. Such sensors may be used in conjunction with the array of single or multi-axis sondes 630 of the smart paint stick device 600 to further refine location data of the paint mark locations.

In yet other embodiments, other technologies such as, but not limited to, wireless device or modules may be used to communicate data with a base element. An optical sensor element 680 comprising of various optical sensors configured to determine colors may be included with the smart paint stick device 600. Optical sensor element 680 may be used to determine the color of paint used for each paint mark as well as used to determine the surface in which the paint mark has been applied. The optical sensors 680 may further be enabled to track movement over the ground and determine the height of the smart paint stick device 600 from the ground. When used in conjunction with accelerometers and gyroscope sensors, a greater approximation of the location of the paint mark left by the smart paint stick device may be determined.

Figure 7:
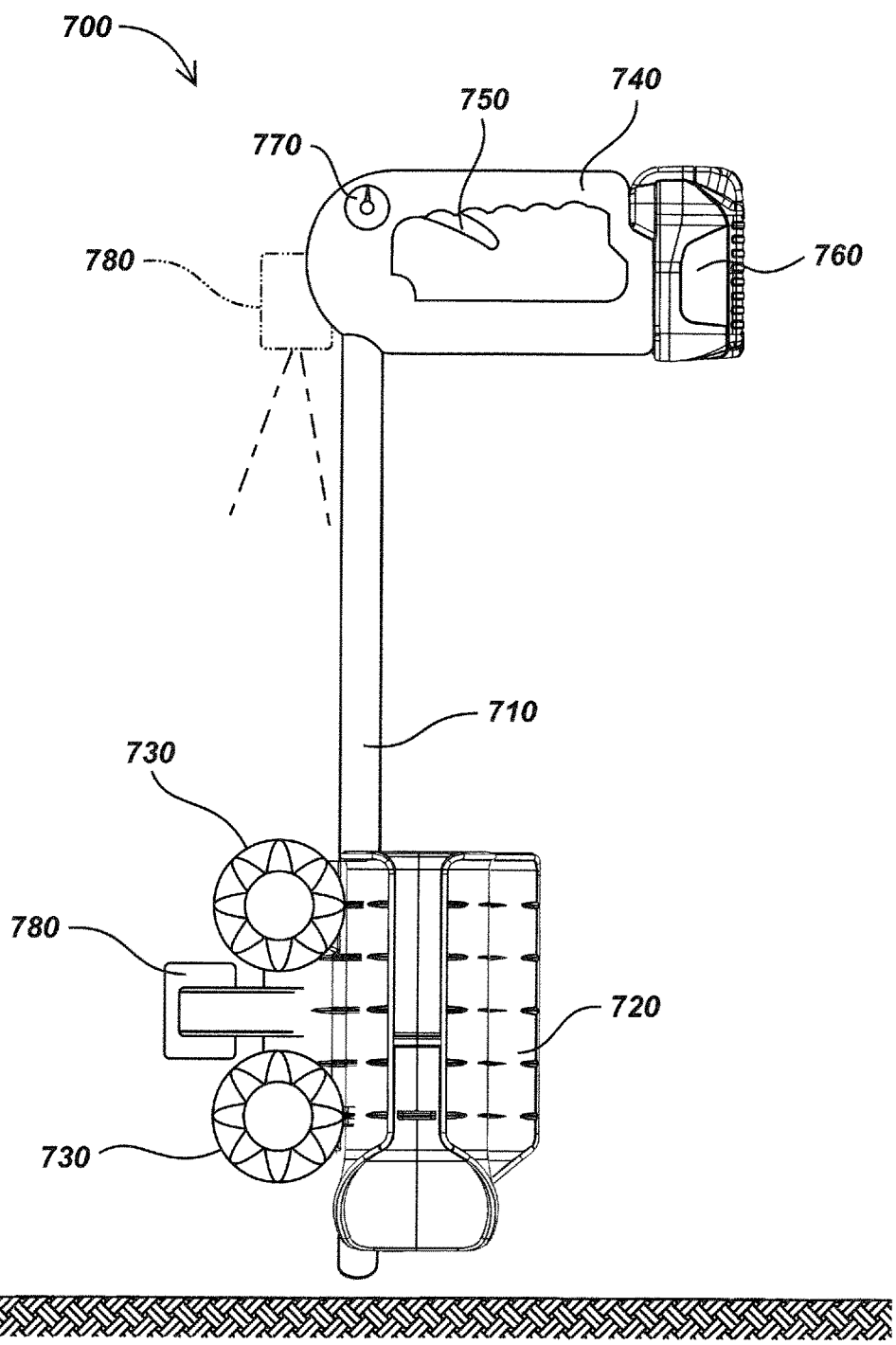
FIG. 7 is a side view of an embodiment of a smart paint stick device with a camera element.

FIG. 7 illustrates details of another smart paint stick embodiment 700. Embodiment 700 may include an elongate structural element, such as central shaft 710, along with a paint receptacle 720, which may be configured to hold multiple paint cans. The paint receptacle may be mounted or positioned near or along the bottom end of the central shaft 710. In FIG. 7, the paint receptacle 720, as illustrated, is configured to accommodate paint canisters. Alternative embodiments may be configured to accommodate other mechanisms of holding paint to create paint marks, such as paint pouches, compressors, or other mechanisms.

Paint receptacle 720 may also include other sensor elements, such as compass sensors or RFID readers, to interpret information encoded in the specific paint container. Methods of encoding paint canisters and containers are discussed subsequently herein. A beacon element, such as the array of single or multi-axis sondes 730, may be located above the paint receptacle 720 along the central shaft 710. A handle 740 with a trigger 750, a battery 760, and a paint-selector dial 770 may be located the top end of the central shaft 710. The paint-selector dial 770 may be configured to allow the user to physical select the desired color or type of paint stored within the paint receptacle 720.

In alternative embodiments, a portable utility locator device may be configured to allow a user to select the color(s), pattern(s), letter(s), symbol(s), image(s), or other characteristics of applied paint, either automatically or manually. The battery 760 may be configured to power the array of single or multi-axis sondes 730 such that when a user activates the trigger 750, paint may be sprayed and a signal may generated by the array of single or multi-axis sondes 730 simultaneously or in a related time interval. In some embodiments, the beacon element or other elements of the smart paint stick may further include additional components and sensors, such as accelerometers and gyroscope sensors that are not illustrated. Such sensors may be used in conjunction with the array of single or multi-axis sonde 730 of the smart paint stick device 700 to further refine location data of the paint mark locations. In yet other embodiments, other technologies such as, but not limited to, wireless transmitter devices or modules may be used to communicate data with a base element or other system or device. In some smart paint embodiments such as device embodiment 700, a camera element 780 or other imager or image sensing element may be included to capture images of deployed paint marks or other images or information associated with a surface such as the ground. In such embodiments, optical character recognition software or other feature recognition technology may be used to recognize characters or other information or features of the paint mark and/or surface.

In an exemplary embodiment, camera element 780 may optionally be placed on handle 740. Image data may be stored locally on a transmitter wirelessly.

Figure 8:
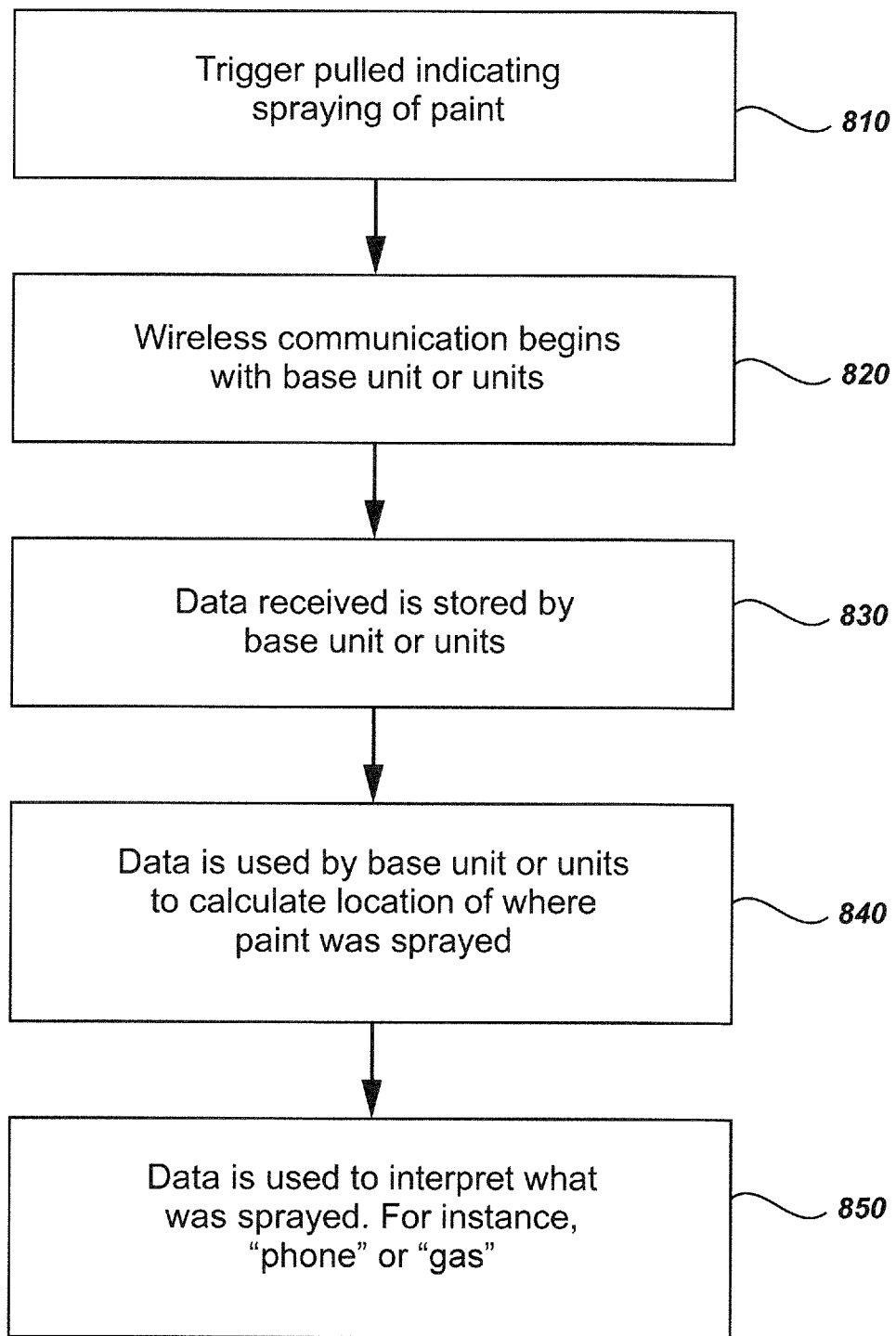
FIG. 8 is a block diagram describing an embodiment of a method by which a smart paint stick device may operate when paint mark recognition is employed.

FIG. 8 illustrates details of an embodiment of a process for operating a smart paint stick device, such as those described previously herein. At stage 810 the device may be activated by a user pulling a trigger, with paint sprayed and simultaneously or in an associated time interval a signal generated and sent to a base element or elements. At stage 820, data may be wirelessly exchanged between the smart paint stick device and base element or other device or system. At stage 830, communicated data may be stored in the base element or other devices or systems. At stage 840, the received data may be processed, such as in a processing element of the base element or other devices, so as to determine the approximate location of the paint mark. At stage 850, data communicated to the base element may be used to interpret the particular text or information about the utility or other buried object being located, as well as the color of the paint mark and/or other information associated with the marking process.

Figure 9:
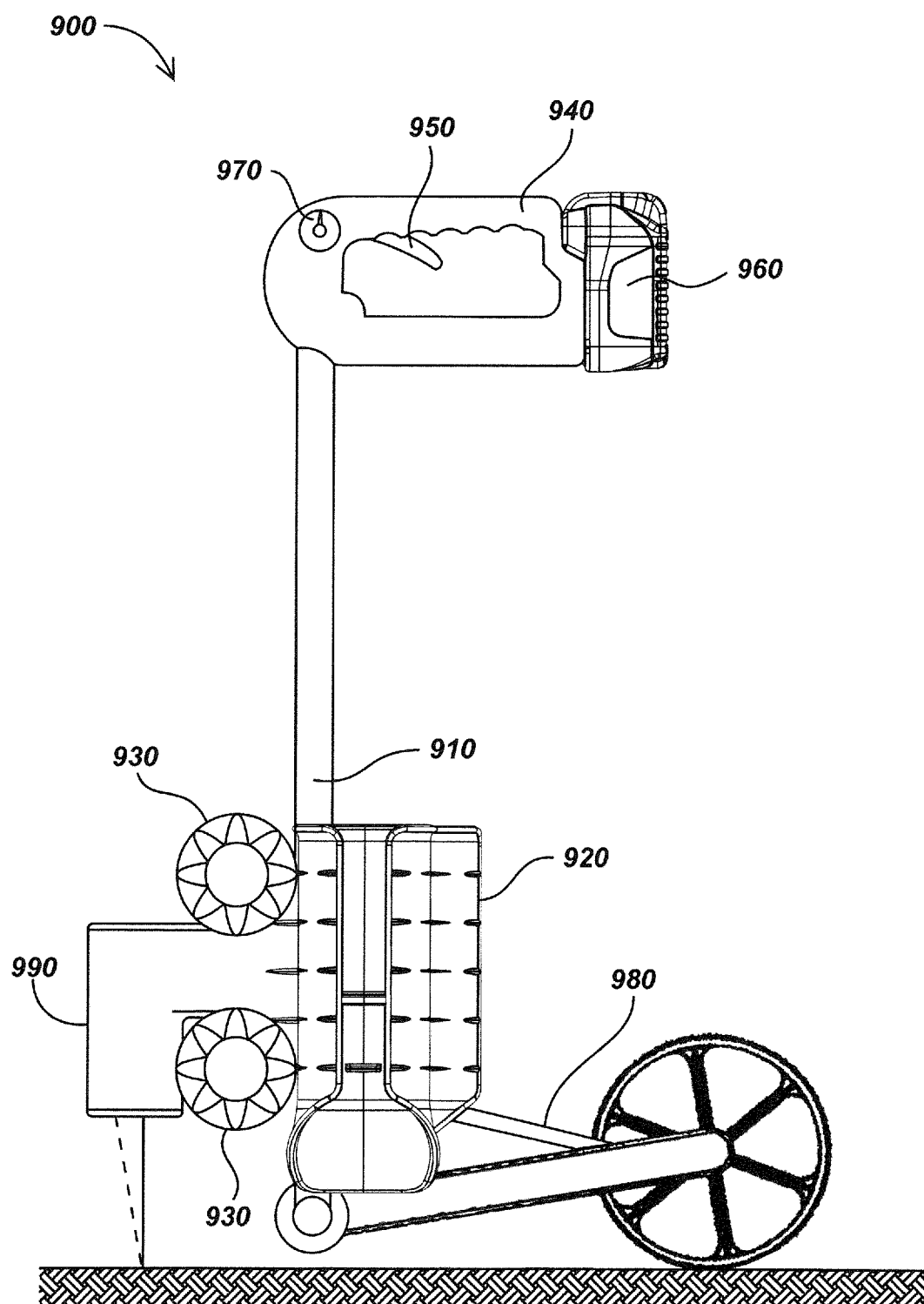
FIG. 9 is a side view of an embodiment of a smart paint stick device with a ground tracker element.

FIG. 9 illustrates details of an embodiment of a smart paint stick device 900. Smart paint stick device 900 may include an elongate support structure, such as central shaft 910 and a paint receptacle 920, which may be configured to hold multiple paint cans. The paint receptacle may be mounted or positioned along or near or the bottom end of the central shaft 910. In FIG. 9, the paint receptacle 920, as illustrated, is designed to accommodate paint canisters. Alternative embodiments may be designed to accommodate other mechanisms of holding paint in order to create paint marks, such as paint pouches, compressors, or other paint storage mechanisms.

The paint receptacle 920 may also include a sensor module with sensor elements, such as compass sensors or RFID readers, to interpret information encoded in the specific paint container. Methods of encoding paint canisters and containers are discussed subsequently herein. A beacon element, such as the array of single or multi-axis sondes 930, may be located above the paint receptacle 920 along the central shaft 910. A handle 940 with a trigger 950, a battery 960, and a paint-selector dial 970 may be located the top end of the central shaft 910.

A paint-selector dial 970 may be configured to allow a user to physically select a desired color or type of paint stored within the paint receptacle 920. In alternative embodiments, an enabled portable utility locator device may be configured to select the color either automatically or manually. The battery 960 may be enabled to power the array of single or multi-axis sondes 930 such that when a user activates the trigger 950, paint may be sprayed and an electromagnetic signal may be generated by the array of single or multi-axis sondes 930 simultaneously or in an associated time interval.

In some embodiments, the beacon element may further include additional components and sensors, such as accelerometers and gyroscope sensors that are not illustrated. Such sensors may be used in conjunction with the array of single or multi-axis sonde 930 of the smart paint stick 900 to further refine location data of the paint mark locations. In yet other embodiments, other technologies such as, but not limited to, wireless devices or modules may be included to communicate data with a base element or other system or device.

Figure 10:
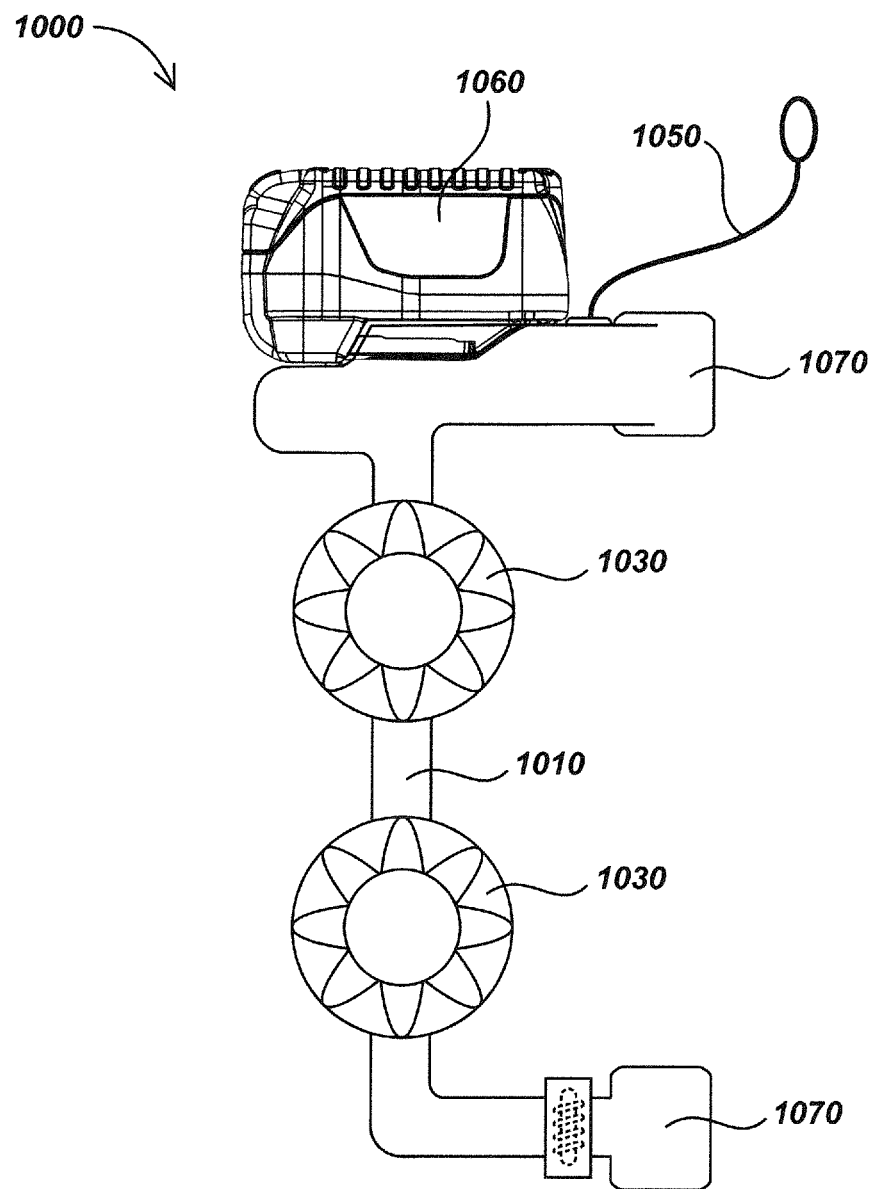
FIG. 10 is a side view of an embodiment of a smart paint stick attachment device.
Figure 11:
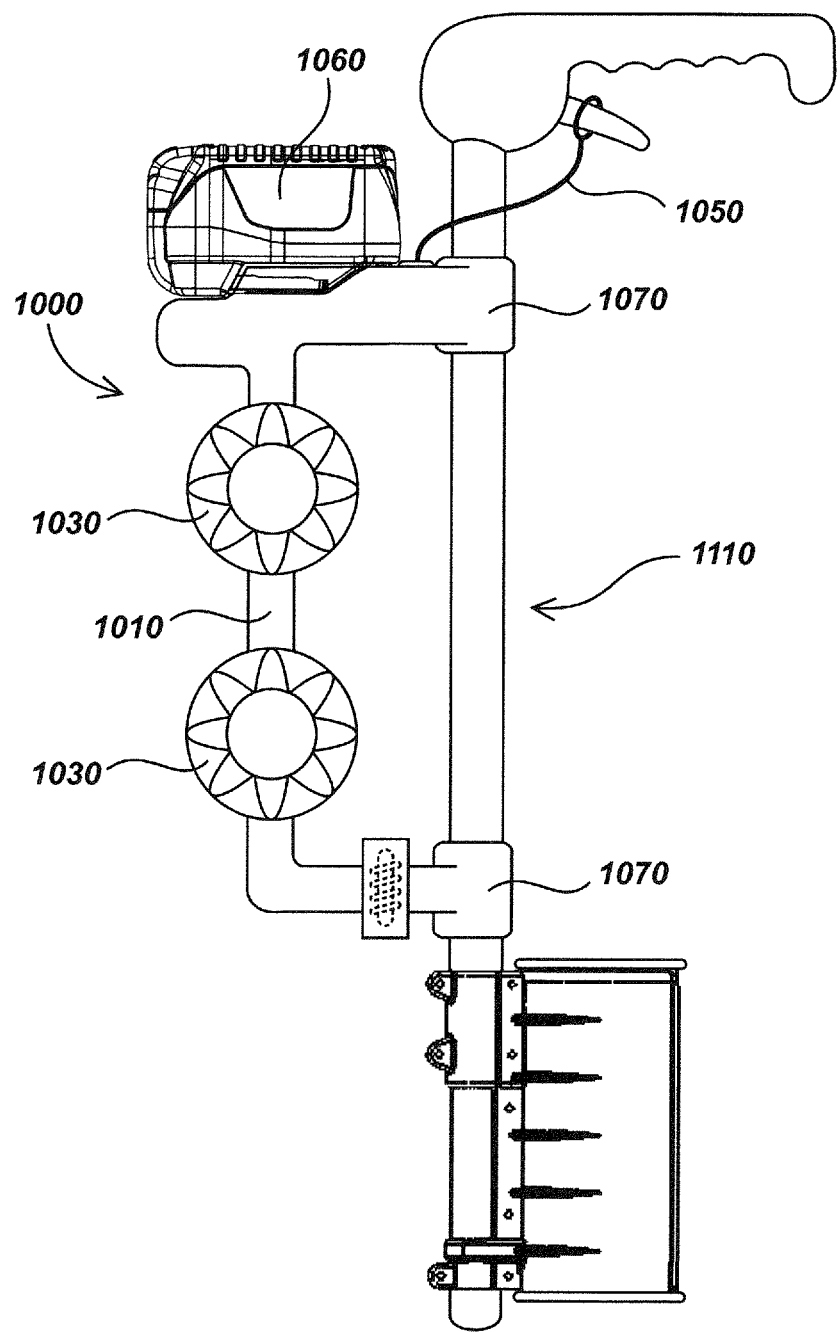
FIG. 11 is a side view of the embodiment of FIG. 10 attached to a conventional paint stick.
Figure 12:
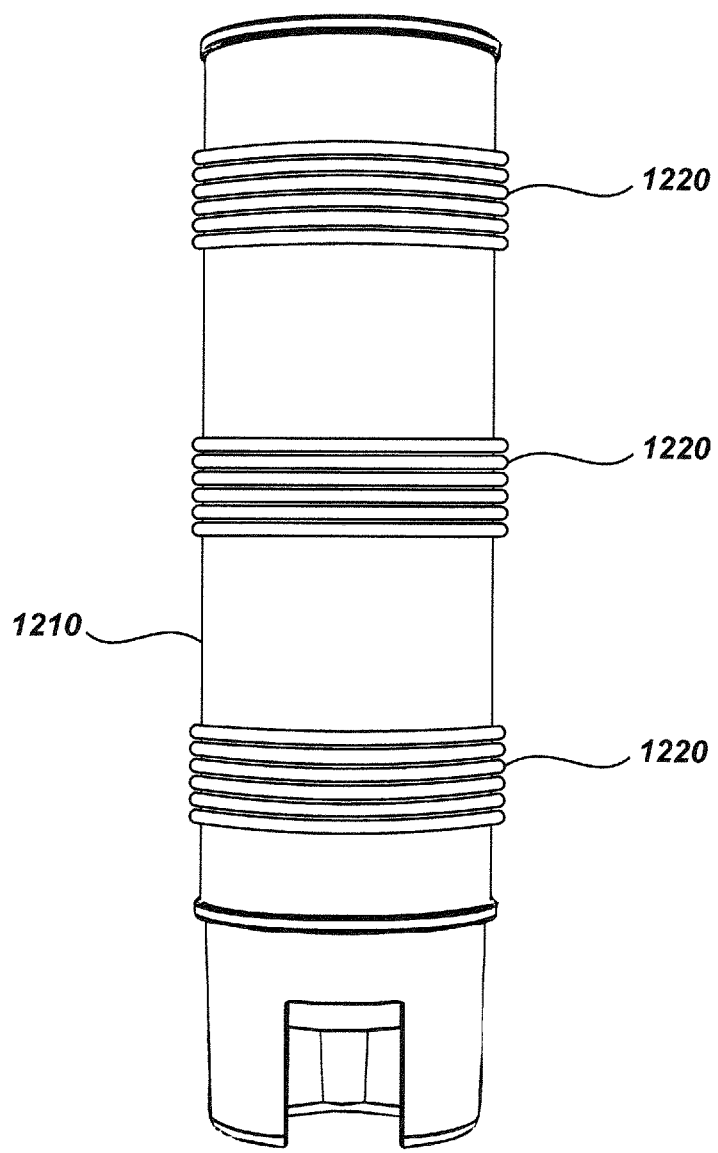
FIG. 12 is a paint canister within a series of coils demonstrating a possible way of encoding the canister with information.

Smart paint stick device embodiment 900 may include a ground tracking element or device 980 configured to physically measure distances by counting rotations of a wheel as it is rolled along the ground. Smart paint stick device embodiment 900 may include an optical ground tracking element or device 990 configured to optically measure distances and images over and on the ground. Further technical details regarding ground tracking technology as may be used to implement ground tracking are described in U.S. patent application Ser. No. 12/827,993, U.S. patent application Ser. No. 11/782,572, U.S. patent application Ser. No. 13/766,670, and U.S. patent application Ser. No. 13/161,183, which are incorporated by reference herein. In such embodiments, optical sensors may also be utilized to record the surface colors and/or be used as a mapping tool of the ground where paint marks are applied. Turning to FIGS. 10 and 11, various details of an embodiment of a smart paint stick attachment device 1000 in accordance with certain aspects is illustrated. The smart paint stick attachment device embodiment 1000 may include an elongate structural element, such as central shaft 1010, along with one or more beacon elements, such as the array of single or multi-axis sondes 1030, which may be located centrally along the central shaft 1010. A trigger connector 1050 and a battery 1060 may be located at or near the top end of the central shaft 1010.

The trigger attachment 1050 may be configured to signal or indicate to the smart paint stick attachment device 1000 when the trigger of a conventional paint stick or wand, such as the conventional paint stick 1110, has been activated. In some embodiments, the trigger attachment 1050 may include flex sensors that secure to the outside of the trigger. In such embodiments, when the trigger is physically pulled, flex sensors may activate, in turn activating the beacon element of the smart paint stick attachment device 1000.

The battery 1060 may be configured to power the array of single or multi-axis sondes 1030 such that when a user activates the trigger attachment 1050, paint may be sprayed and signals generated by the array of single or multi-axis sondes 1030 simultaneously or in an associated time interval. In some embodiments, the beacon element may further include additional electrical components and sensor, such as accelerometers and gyroscope sensor that are not illustrated. Such sensors may be used in conjunction with the array of single or multi-axis sondes 1030 of the smart paint stick attachment device 1000 to further refine location data of the paint mark locations. In yet other embodiments, other technologies such as, but not limited to, wireless transmitter devices or modules may be used to communicate data with a base element. A series of brackets 1070 may be used to attach the smart paint stick attachment device 1000 to a commercially available paint stick or wand such as the conventional paint stick 1110.

Turning to FIGS. 12-15, an embodiment of a method of magnetically encoding paint canisters, such as paint canister 1210 is illustrated. The method may be used to select, indicate, or associate an area the color of the particular paint. A paint dispensing receptacle, such as those described in FIGS. 1-11, may include one or more sensors, such as compass sensors, optical sensors, magnetic sensors, RF sensors, or other sensors configured to read an encoded paint canister. The paint canister 1210 may be placed within a series of axially spaced high powered toroids, such as the coils 1220 of FIG. 12, or ring coils, such as the three ring coils 1420 of FIG. 14. Magnetized rings, such as the annular magnetized rings 1320 of FIG. 13, may then be magnetized into the paint canister 1210 in a particular pattern depending on the color of the paint. In some embodiments, the color of the paint may initially be determined by a color sensor. In other embodiments, the color of the paint may initially be indicated or defined by a user. Furthermore, this initial magnetization of the annular magnetized rings 1320 may be done during manufacture of the paint canister.

Figure 13:
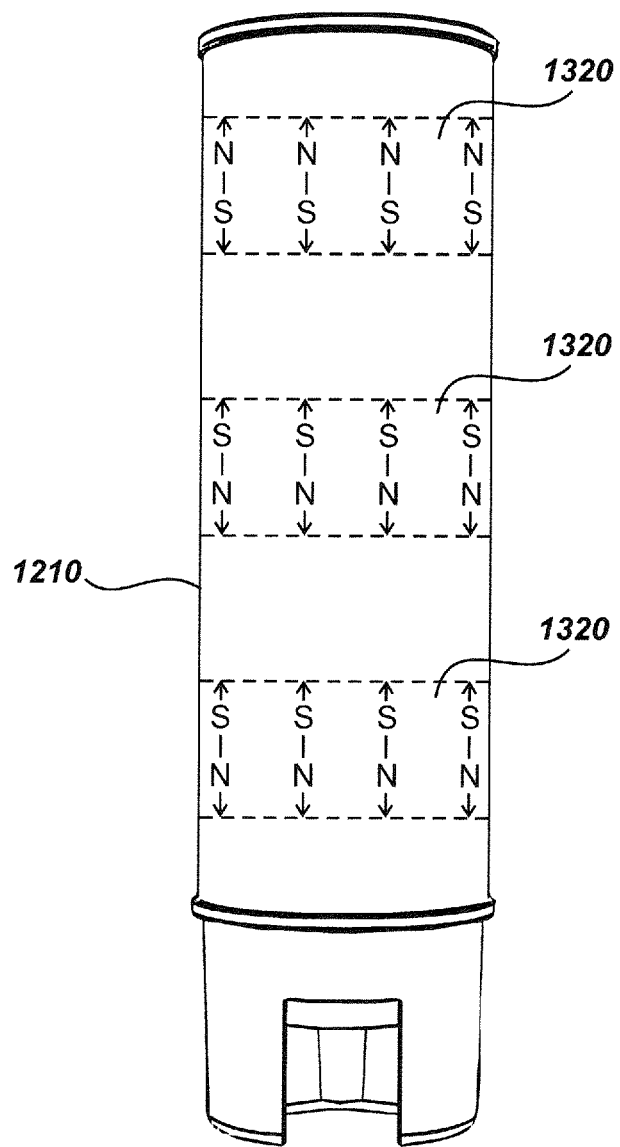
FIG. 13 is an illustration of the paint canister demonstrating possible magnetization patterns.
Figure 14:
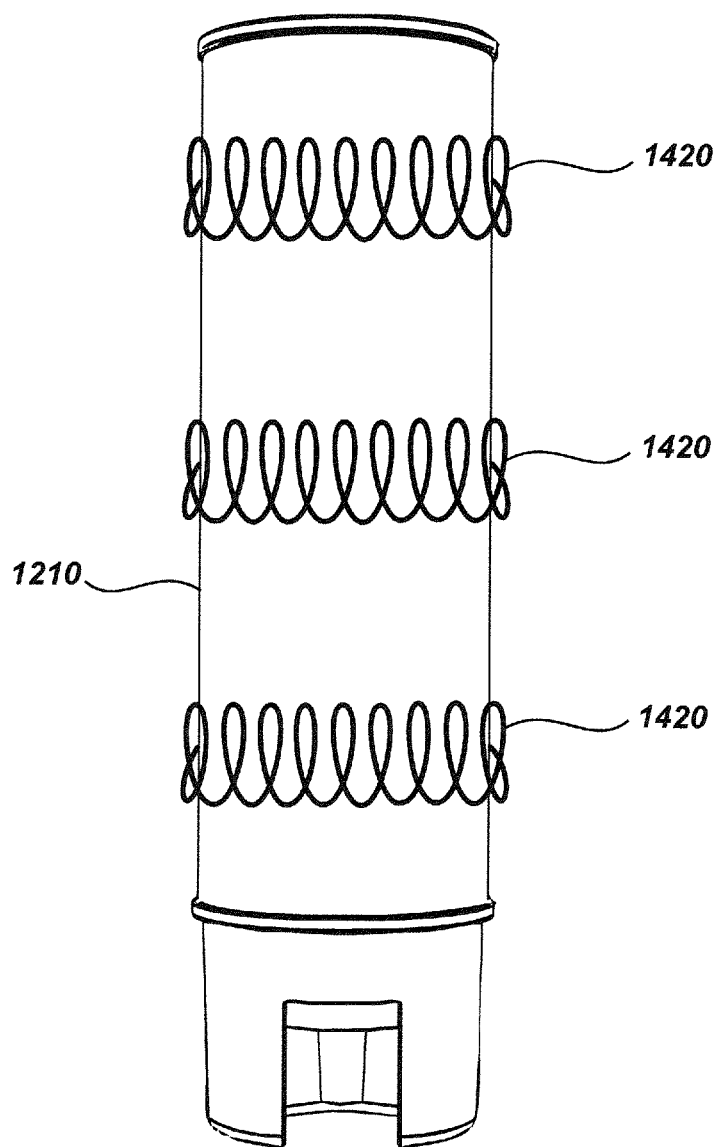
FIG. 14 is a paint canister within a series of ring coils demonstrating a possible way of encoding the canister with information.
Figure 15:
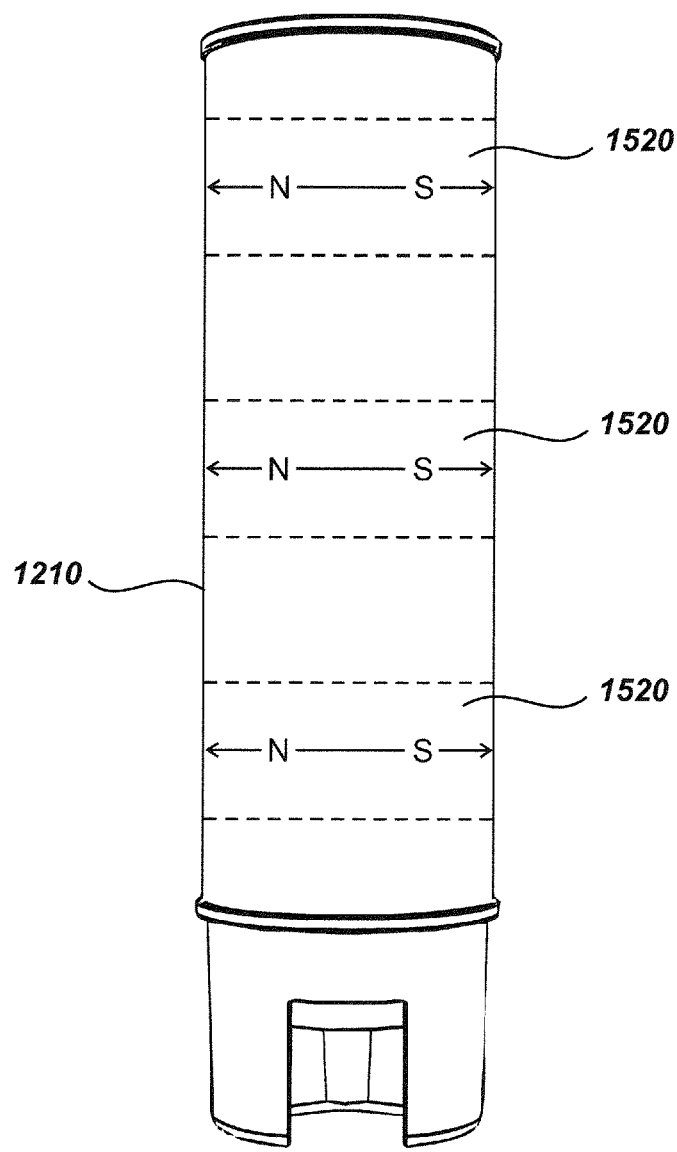
FIG. 15 is an illustration of the paint canister demonstrating possible magnetization patterns.

The direction of the magnetic field of each of the three annular magnetized rings 1320 of FIG. 13 may vary from the direction of the magnetic field of each of the other annular magnetic rings 1320, thereby allowing for a three bit code (or codes of other bit sizes in various embodiments). In some embodiments, a different number of annular rings may be magnetized into the paint canister to encode more or less information into the paint canister. In yet other embodiments, the pattern of the magnetic coding may be done in various other ways of encoding such as are known or developed in the art. For example, as shown in FIG. 15, coding pattern 1520 or alternative pattern 1530 may be used. In yet other embodiments, rings of material such as cold working metals may be fixed to the paint canister to be magnetized. Treatment of the paint canister, including heat or shock, may also be advantageously used for the magnetization process. It will also be apparent to those skilled in the art to apply this method to other packaging besides canisters, such as paint pouches, when the packaging is capable of being magnetized or it is possible to fix encoded materials to the packaging itself. For example, in some embodiment RFID technology may also be employed to encode the paint containers with information.

Figure 16:
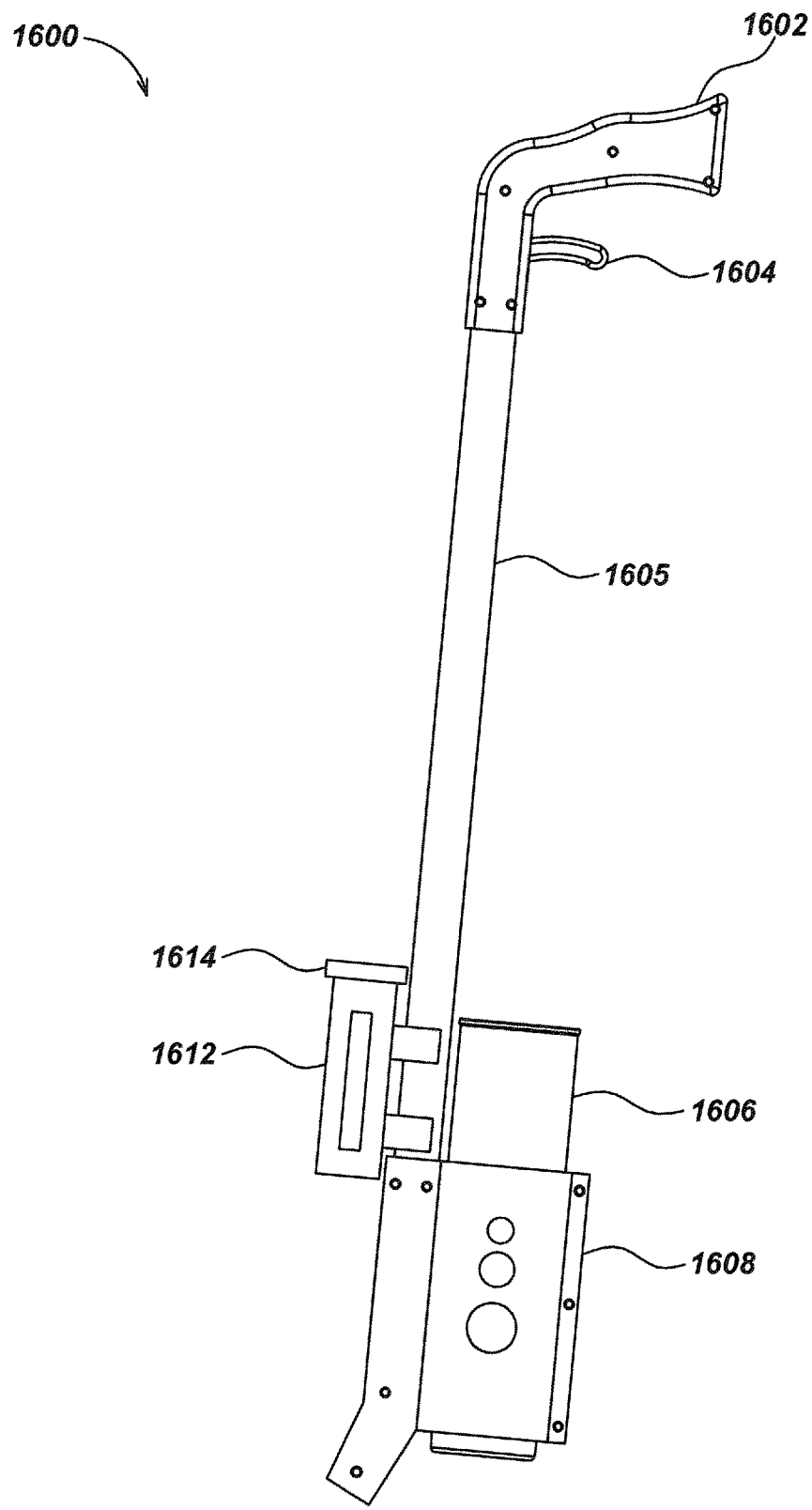
FIG. 16 illustrates details of an embodiment of a paint marking stick with a coupled RFID unit.

Turning to FIG. 16, various details of one embodiment of a paint marking stick 1600 in accordance with aspects of the present disclosure are illustrated. The paint marking stick embodiment 1600 may include an elongated support structure, such as central shaft 1605. A paint receptacle 1608 may be positioned along the bottom end of the central shaft 1605 to hold paint or one or more paint containers. As shown in FIG. 16, the paint receptacle 1608 may be configured to hold spray paint cans, such as spray paint can 1606. A handle 1602, which may include or be coupled to a trigger 1604 and/or a battery (not shown in FIG. 16), may be included in the paint stick 1600, such as by being located at or near a top end of the central shaft 1605.

The paint stick 1600 may include sensors or other elements such as compass sensors, inertial navigation sensors, Bluetooth transmitters, and/or RFID transmitters and readers, such as a passive RFID element 1612 to interpret information encoded in the specific paint container or otherwise associated with the paint being used, or to transmit signals to a nearby locator. Such signals may specify a color of the paint, when the trigger 1604 is actuated, or when paint is dispensed from the paint can 1606. For example, the passive RFID element 1612 may be coupled with a color indication adjuster dial 1614 or with a color sensor (not shown in FIG. 16).

Figure 17:
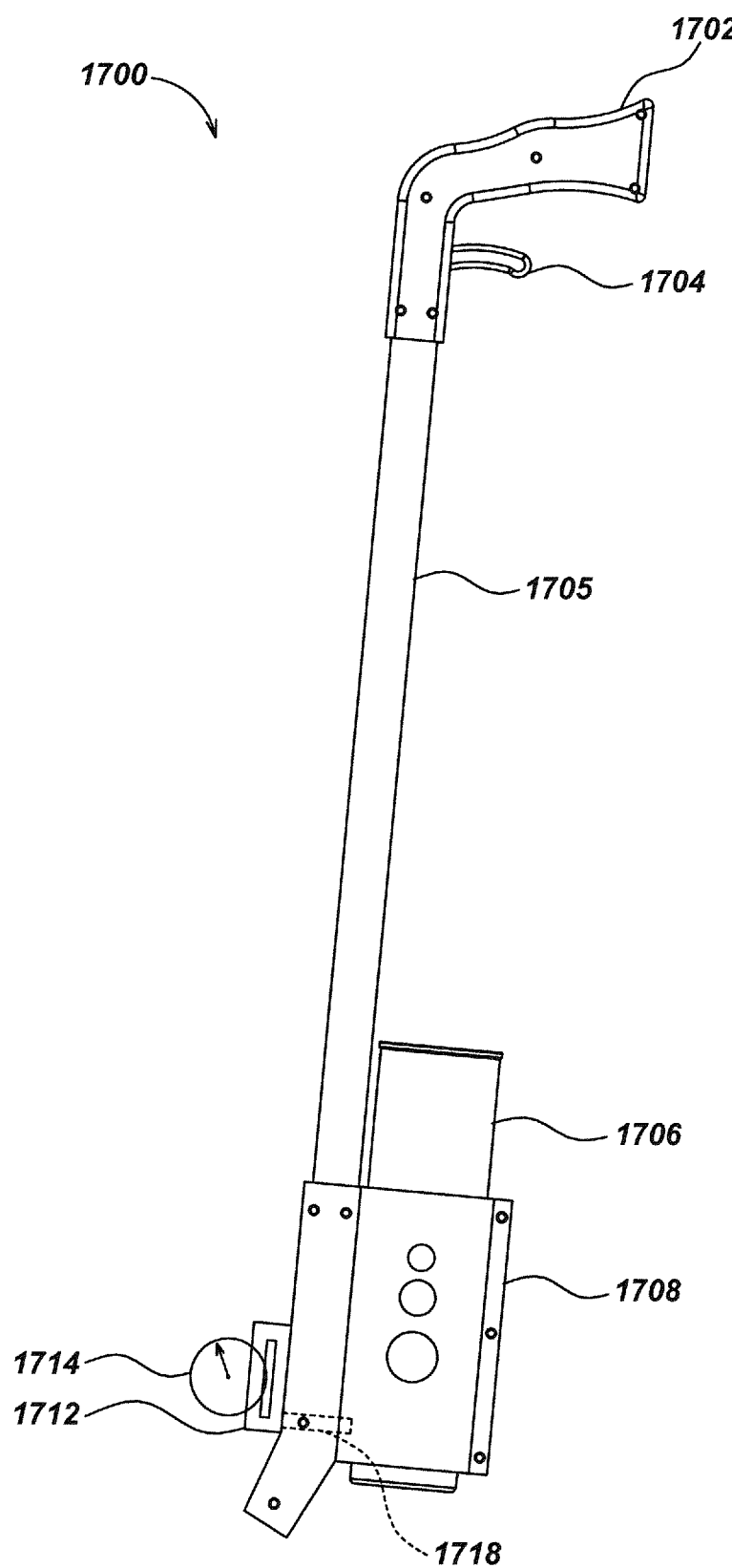
FIG. 17 illustrates details of an alternate embodiment of a paint marking stick with an RFID unit and a trigger sensor.

Turning to FIG. 17, various details of one embodiment of a paint marking stick 1700 in accordance with aspects of the present disclosure are illustrated. The paint stick 1700 may include an elongated support structure, such as central shaft 1705. A paint receptacle 1708 may be positioned along the bottom end of the central shaft 1705 to hold paint or one or more paint containers. As shown in FIG. 17, the paint receptacle 1708 may be configured to hold spray paint cans, such as spray paint can 1706. A handle 1702, which may include or be coupled to a trigger 1704 and/or a battery (not shown in FIG. 17), may be included in the paint stick 1700, such as by being located at or near a top end of the central shaft 1705.

The paint stick 1700 may include sensors or other elements such as compass sensors, inertial navigation sensors, Bluetooth transmitters, and/or RFID transmitters or readers, such as a passive RFID element 1712 to interpret information encoded in the specific paint container or otherwise associated with the paint being used, or to transmit signals to a nearby locator. Such signals may specify a color of the paint, when the trigger 1704 is actuated, or when paint is dispensed from the paint can 1606. For example, the RFID element 1712 may be coupled with a color indication adjuster dial 1714 or with a color sensor (not shown in FIG. 17). In an exemplary embodiment, a low powered sonde may alternately be used in place of the passive RFID element 1712.

A magnetic or mechanical actuation sensor, such as actuation sensor 1718 may be disposed on paint stick module 1700. Implementation of the actuation sensor 1718 may include placing a magnet on an actuation component (e.g., component 2304 of FIG. 23, which is described herein) configured to activate a nozzle of the paint can 1706, and then sensing changes in the magnetic field at the actuation sensor 1718 (e.g., magnetic sensor) when the magnet disposed on the actuation component moves with respect to the actuation sensor 1718. In an exemplary embodiment, actuation sensor 1718 may be coupled to the central shaft 1705 near the paint can receptacle 1708.

Figure 18A:
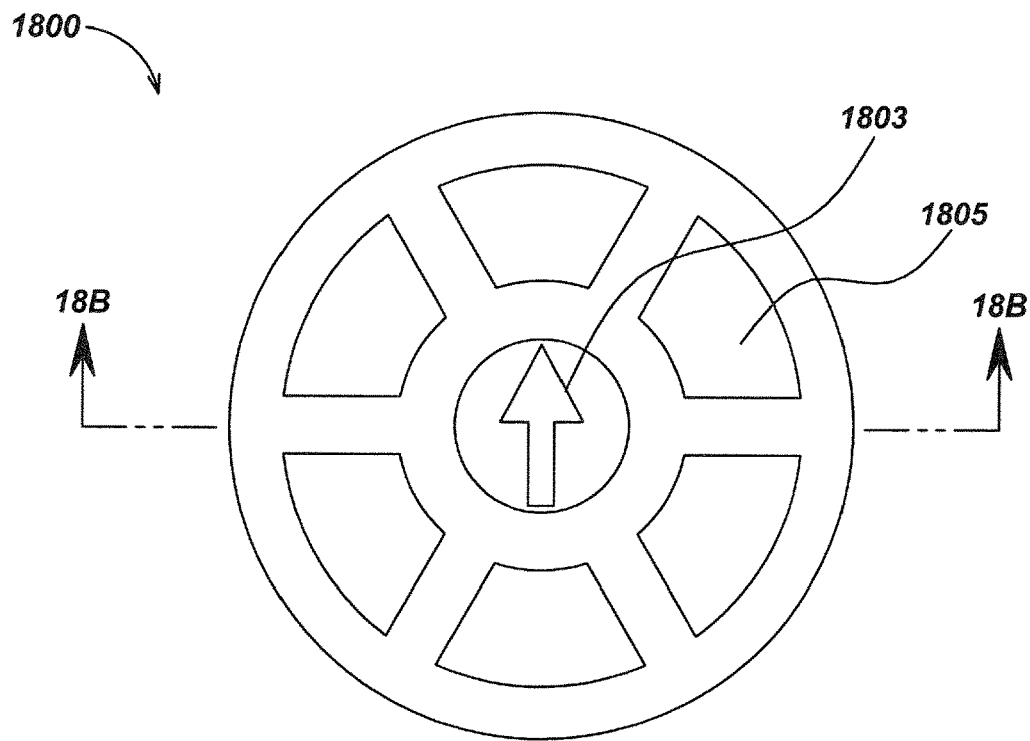
FIG. 18A illustrates details of an embodiment of a paint can color setting dial, viewed from the topside thereof.

FIG. 18A illustrates details of an embodiment of a paint can color setting selector 1800, viewed from the topside thereof. In an exemplary embodiment, the selector 1800 may include a ring or dial that may be rotated until an arrow or color selector 1803 points to one of a plurality of color options 1805, as shown in FIG. 18A. Alternate embodiments may include fewer or more color options, or may digitize the selector 1800 on a screen (not shown, but including a screen on a nearby locator). For example, color options 1805 may include various colors, such as red, green, blue, yellow, orange, and purple. Colors, such as white and pink may optionally be used. One of skill in the art will appreciate that the different colors may refer to or be otherwise associated with types of buried objects, including communication lines, gas lines, sewer lines, and other utilities.

Figure 18B:
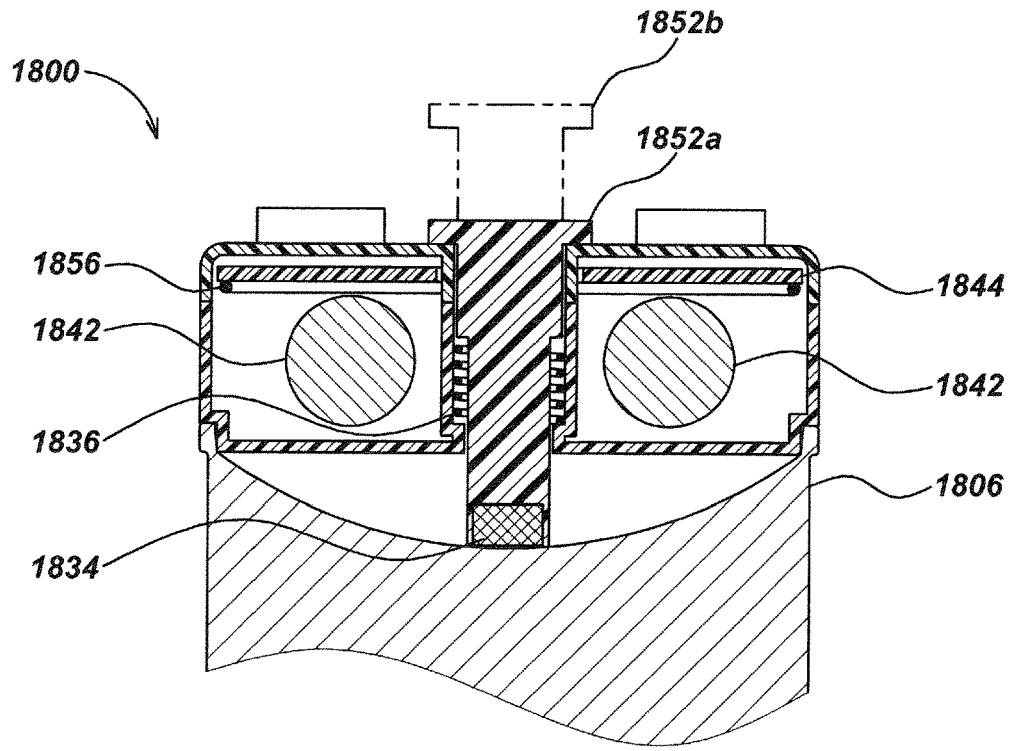
FIG. 18B is a cross-section of the paint can color setting dial embodiment of FIG. 18A, taken through line 18B-18B.

The paint can color setting selector 1800 shown in FIG. 18A may include other features as shown in FIG. 18B, which illustrates a cross-section of the paint can color setting dial 1800 of FIG. 18A, taken through line 18B-18B. For example, sensors or other elements may be used, including a wire coil sonde 1856, one or more batteries, such as a pair of AA batteries 1842, and a printed circuit board, such as a PCBA 1844. The selector 1800 may couple to a central shaft of a paint stick (e.g., shaft 1705 of paint stick 1700), or may couple to a paint can (e.g., paint can 1706) by magnetically coupling to the bottom of the paint can, or by snapping into or around a rim at the bottom of the paint can. When the selector 1800 is snapped into place, a low power Hall Effect switch may be used to activate the selector 1800.

An attachment pin 1852a (shown in attached or down position) may be configured with a spring mechanism, which may include spring 1836. Attachment pin 1852b may also be configured in the detached or up position, as shown in FIG. 18B. A magnet 1834 may be disposed at one end of the attachment pin 1852a to magnetically couple the selector 1800 to a suitable surface of the paint can 1806.

Figure 19A:
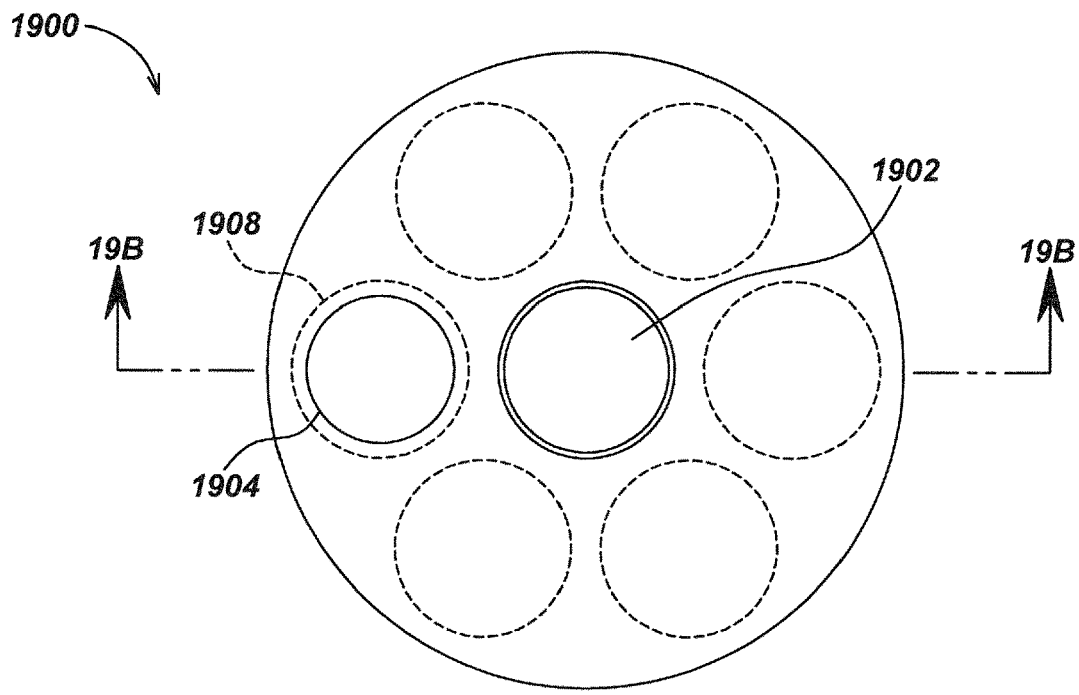
FIG. 19A illustrates details of an embodiment of a paint can color setting dial, taken from the topside thereof.
Figure 19B:
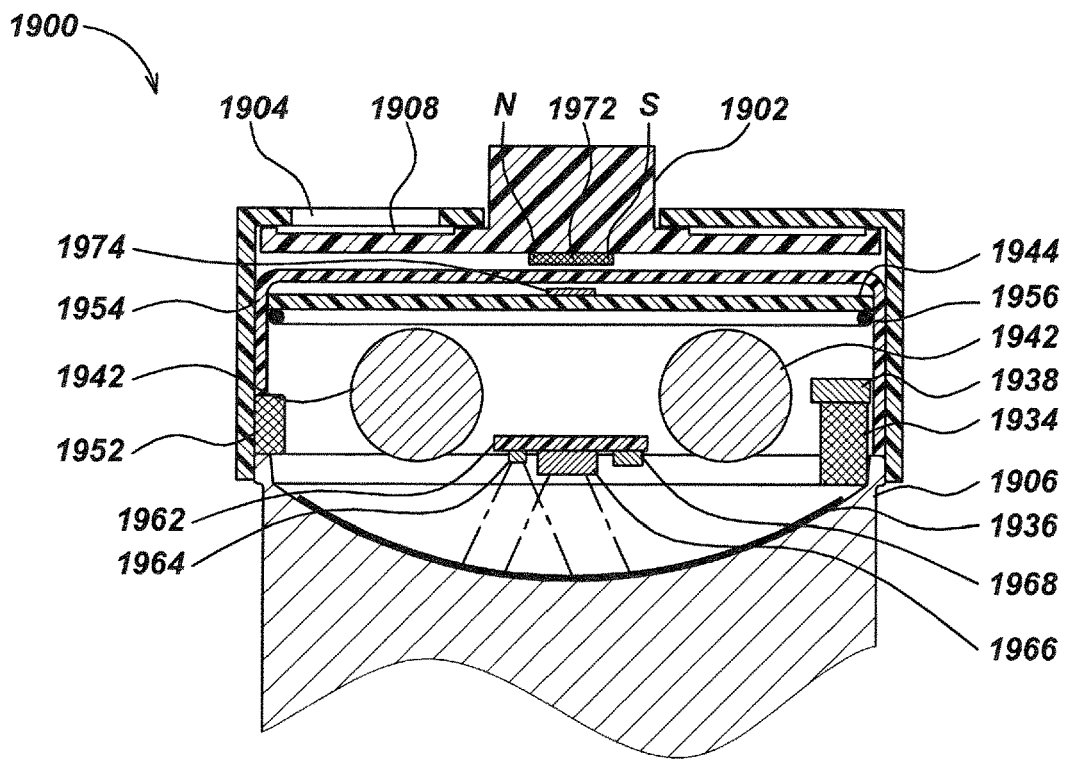
FIG. 19B is a cross-section of the paint can color setting dial embodiment of FIG. 19A, taken through line 19B-19B.

FIG. 19A illustrates details of another embodiment showing a paint can color setting selector 1900, viewed from the topside thereof. In an exemplary embodiment, selector 1900 may be rotated by turning selector dial 1902 (as shown in FIGS. 19A and 19B) until one of a plurality of windows 1904 (as shown in FIGS. 19A and 19B) exposes the underlying matching color swatch or spray paint can color 1908 (as shown in FIGS. 19A and 19B). Although not shown, the windows 1904 may only include one window.

FIG. 19B is a cross-section of the paint can color setting selector 1900 of FIG. 19A, taken through line 19B-19B. The selector 1900 may enclose various components, including sensors or other elements, such as an acoustic sensor 1938, a wire coil sonde 1956, a printed circuit board (PCB) 1944, a PCB support 1954, one or more batteries, such as a pair of AA batteries 1942, and one or more magnets, such as magnet 1934 or attachment magnet 1952, for securing the selector 19000 to the back of a metal paint can 1906 PCB support 1954 may couple to magnet 1952, which is disposed between the PCB support 1954 and the paint can 1906. Alternative, the PCB support 1954 may couple to magnet 1934 in a manner where the PCB support 1954 and the paint can 1906 are thermally connect to thereby permit the PCB support 1954 and paint can 1906 to operate as a heat sink for the PCB 1944.

A North-South magnet 1972 is also shown, which may rotate with the dial 1902, and a rotary magnet sensor 1974 may sense when the magnet 1972 rotates. Rotation of the magnet 1972 may be correlated to a color shown via the window 1904.

The PCB 1962 may be coupled to the PCB support 1954 via magnets 1934 and 1952 or another coupling feature such as adhesive or mechanical fastener. Various components may be disposed on the PCB, including an LED 1964, an image sensor 1966 configured to sense a color or code 1936 applied to the bottom of the paint can 1906, and an acoustic sensor (e.g., a microphone) 1968. The LED 1965 may illuminate the inverted bottom of the paint can 1906 so the color sensor 1966 can detect an image or color disposed on the bottom of the paint can 1906. The color sensor 1966 may include an imaging component configured to detect a color disposed on the bottom of the paint can 1906, or a code reader component configured to detect a code (e.g., bar code) disposed on the bottom of the paint can 1906.

The acoustic sensors 1938 and 1968 may be configured to sense a sound associated with paint dispensing from the paint can 1906, and may be calibrated to discern or selectively disregard other sounds, including such sounds associated with movement of the charging component inside the paint can 1906.

Testing has shown that the sound of paint dispensing from an aerosol paint can, as detected from the bottom of the paint can, occurs at a particular frequency (e.g., 5 kHz) that is discernible from other sounds at different frequencies (e.g., a sound occurring when the charging element inside the paint can rattles). It is contemplated that an amplifying or directional means may be attached to the paint can 1906 or the acoustic sensor 1938 or 1968 to improve detection of the dispensing of paint.

It is contemplated that an acoustic sensor could be used to detect the sound of paint dispensing from another location of the paint can (e.g., the side of the paint can, at the exit nozzle of the paint can, and other locations).

It is further contemplated that detection of resonance changes of the paint can 1906 at different volumes of paints may be used to estimate the level of paint volume inside the paint can 1906, or to further detect when the paint can 1906 is dispensing paint.

Figure 23:
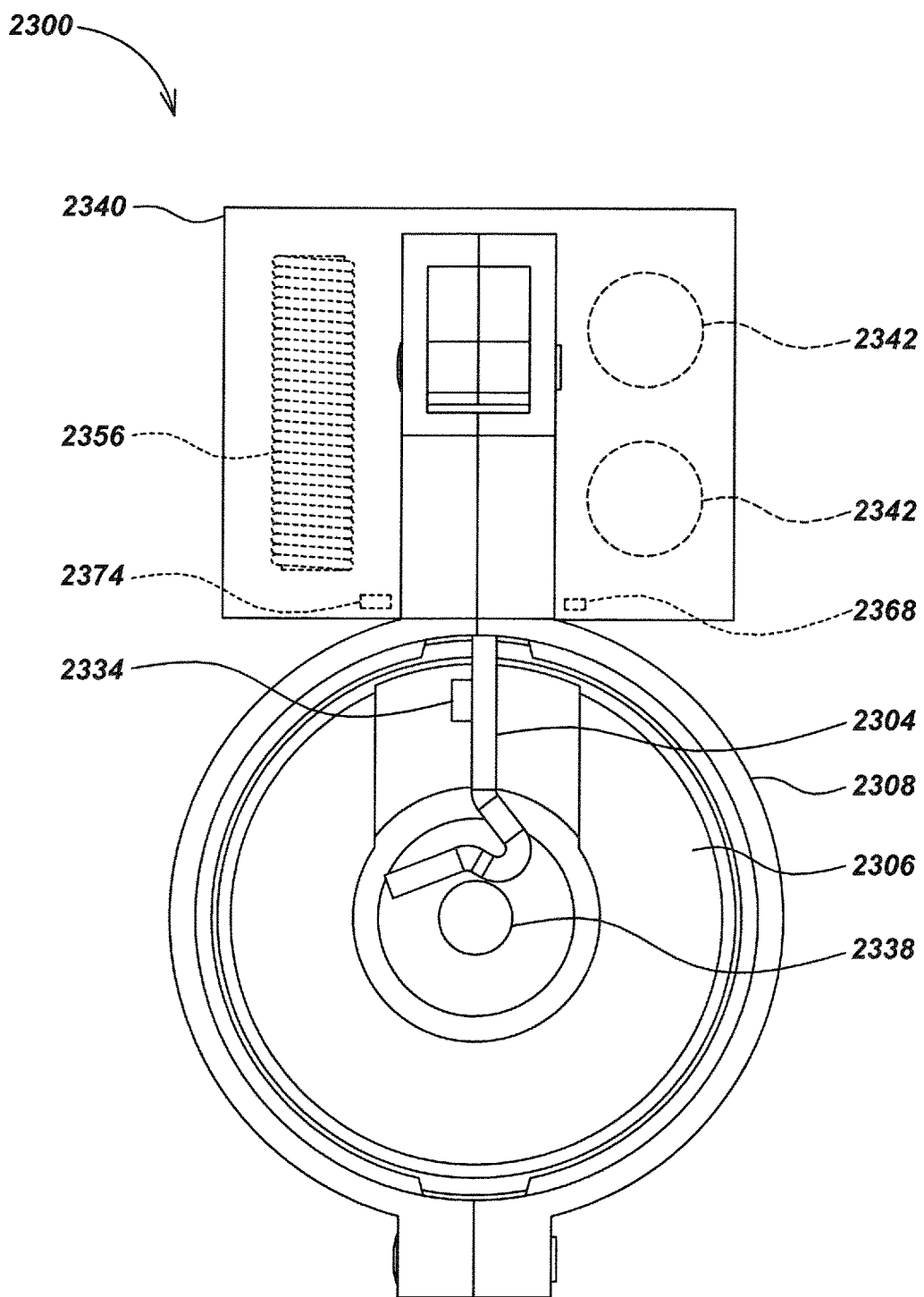
FIG. 23 is a top view illustration of an embodiment of a paint can activation and/or color sensing unit, among other features including a paint can actuator.

It is further contemplated that an acoustic sensor may be used to detect a sound associated with actuation of a trigger (e.g., trigger 1704) or other actuation component (e.g., nozzle actuation component 2304 of FIG. 23 described herein, or a clicking component configured to generate a distinct clicking sound).

A transmission of the wire coil sonde 1956 may occur upon the acoustic sensors 1938 or 1968 sensing the sound associated with paint dispensing or which actuation of a trigger or other actuation mechanism. For example, the sonde 1956 may be configured to transmit the color of the paint as data (e.g., PSK, FSK or any other known means), or as a change in sonde frequency. Color might also be transmitted as a radio signal, say via Bluetooth LE.

The transmission of the wire coil sonde 1956 may be received by a nearby locator, which then uses the transmission to determine a relative position of the wire coil sonde 1956 with respect to the locator and/or the color of the paint. The relative position may then be used to determine a position of the dispensed paint on a surface.

One or more inertial sensors (not shown) may also be enclosed in the selector 1900 and used to determine a tilt of the paint can 1906. The tilt may then be transmitted to the locator to determine the position of the dispense paint on the surface. Alternative, a processing component (e.g., on the PCB 1962) may determine the position of the dispensed paint on the surface, or may provide some processing of the tilt data before that data is transmitted to the locator for further processing.

Figure 20A:
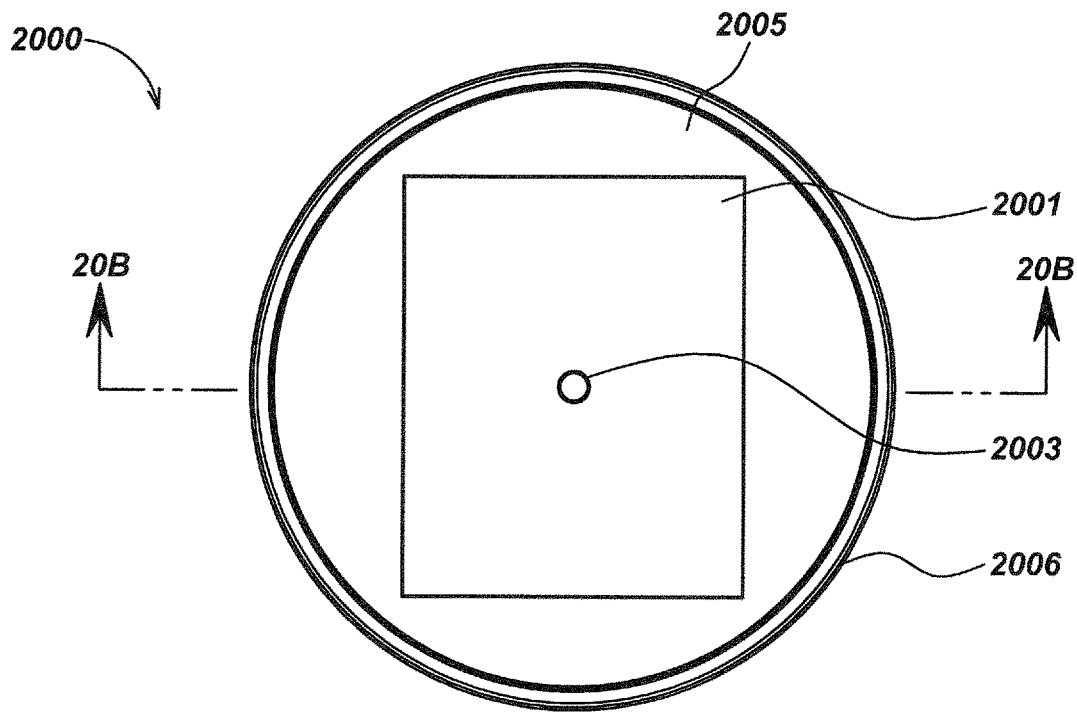
FIG. 20A illustrates details of an embodiment of a paint can color setting dial, taken from the topside thereof.

FIG. 20A illustrates details of an embodiment of a paint can color setting selector 2000, viewed from the topside thereof. In an exemplary embodiment, the selector 2000 may be rotated until an indicator, such as illumination from an RGB LED (not shown), is displayed through window 2003 to indicate a matching paint can color. In an exemplary embodiment, access door 2001 may be disposed on the surface of top plastic cover 2005.

Figure 20B:
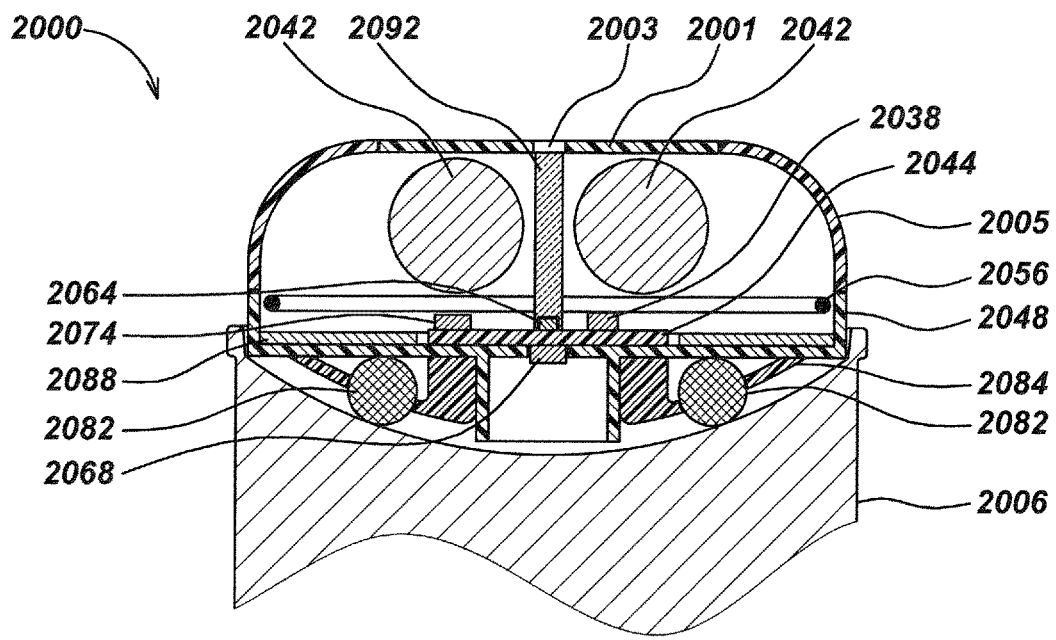
FIG. 20B is a cross-section of the paint can color setting dial embodiment of FIG. 20A, taken through line 20B-20B.

FIG. 20B is a cross-section of the selector 2000 of FIG. 20A, taken through line 20B-20B. The selector 2000 may include sensors or other elements, such as an acoustic sensor 1938, a wire coil sonde 2056, one or more batteries, such as a pair of AA batteries 2042, and one or more magnets, such as a ball magnets 2082 that are held into place by ball magnet carrier 2084, for securing the selector 2000 to an inverted bottom of metal paint can 2006.

Actuation (e.g., rotation) of selector 2000 may cause ball magnets 2082 to move in a circular direction along metal plate 2088 while maintaining their magnetic coupling to the metal plate 2088 and the bottom of the paint can 2006. Alternatively, the ball magnets 2082 to move in a circular direction along bottom of the paint can 2006.

The selector 2000 may include an indicator, such as an RGB LED 2064 which may provide illumination through window 2003 via light pipe 2092. A magnet sensor 2074, an acoustic sensor (e.g., a microphone) 2068, and an RGB LED 2064, may be mounted and electrically connected to a printed circuit board (PCB) 2044. Microphone 2068 may be used to provide an acoustic indicator to a user of the selector 2000 or a nearby locator. For example, the microphone 2068 may sense a volume of paint remaining inside the paint can 2006 by sensing the frequency range of paint dispensing, which may differ depending on the volume of the paint inside the paint can.

Figure 21A:
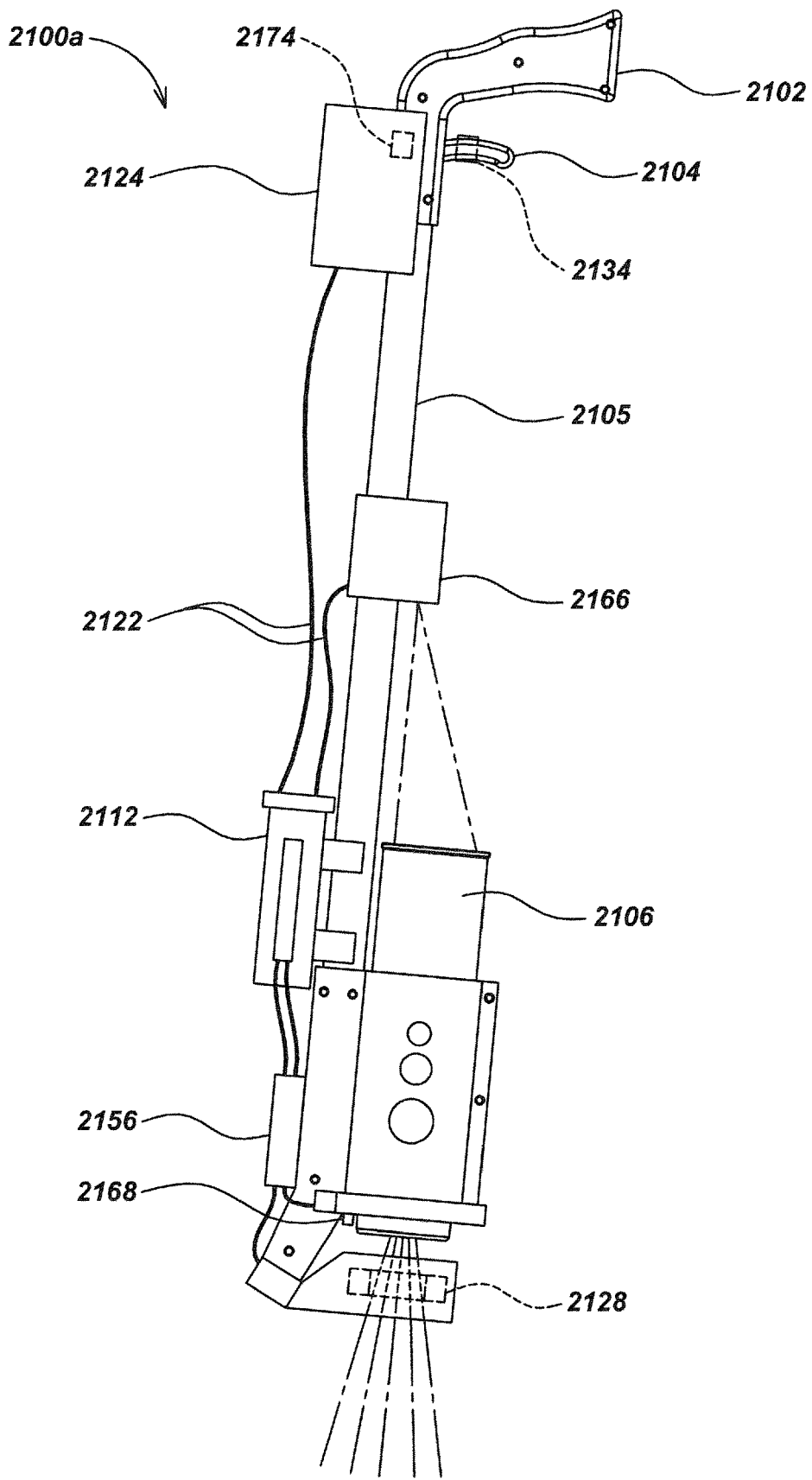
FIG. 21A is a side view of an embodiment of a paint marking stick.

Turning to FIG. 21A, various details of an embodiment of a paint marking stick 2100a in accordance with aspects of the present disclosure are illustrated. The paint stick 2100a may include an elongated support structure, such as central shaft 2105. A paint can 2106 may be disposed in a paint can holster or container on the bottom end of the central shaft 2105. A handle 2102 may include or be coupled to a trigger 2104 and/or a battery (not shown in FIG. 21), and may be located at or near a top end of the central shaft 2105.

The paint stick 2100a may include sensors or other elements such as compass sensors, inertial navigation sensors, Bluetooth transmitters, RFID transmitters, such as a passive RFID element 2112, and/or magnet sensor 2174, as have been described previously herein or are described below.

A passive RFID control enclosure 2124 may be disposed at the upper end of central shaft 2105. An acoustic sensor (e.g., a microphone) 2168 may be disposed near an exit nozzle of the paint can 2106, may sense if the paint can 2106 is dispensing paint, and may sense if the paint can 2106 is dispensing paint at particular levels of internal paint volumes (e.g., full, half full, nearing empty, empty). An indication that the paint can 2106 is dispensing paint, and/or an indication of the level of paint remaining in the paint can 2106 may be provided to a user (e.g., via a screen on the paint stick 2100a, a nearby locator, or a smart phone (not shown), or via a speaker configured to transmit a sound, or via a haptic component configured to transmit a vibration).

Passive RFID 2112 may be electrically connected to RFID control enclosure 2124 and a color sensor 2166 with one or more wires, such as wires 2122. Sonde 2156 may be disposed at the end of shaft 2105 and may be electrically connected to Passive RFID 2112.

A ring coil 2128 may be disposed below paint can 2106, and may include a sonde for transmitted position information relating to the location of the paint stick 2100*a* relative to a nearby locator. The ring coils 2128 may also include a flow sensor configured to detect a flow of dispensed paint.

A magnet 2134 may be disposed on the trigger 2104, and the magnetic sensor 2174 may be disposed to measure a variation of a magnetic field produced by movement of the magnet 2134 when the trigger 2104 is actuated. In this manner, actuation of the trigger 2104 may be sensed by the magnetic sensor 2174.

One of more selection components (e.g., a selector, button) may be disposed on the paint stick 2100*a* (e.g., the control enclosure 2124, or on the handle 2102) to permit an operator of the paint stick 2100*a* to set a type of marking. For instance, the operator may actuate a slider or button that indicates the next mark is a flag, whisker, an RFID marker, a paint dot, or a paint line. Alternatively, the default may be to assume all markings are paint markings unless the selection component indicates otherwise.

Figure 21B:
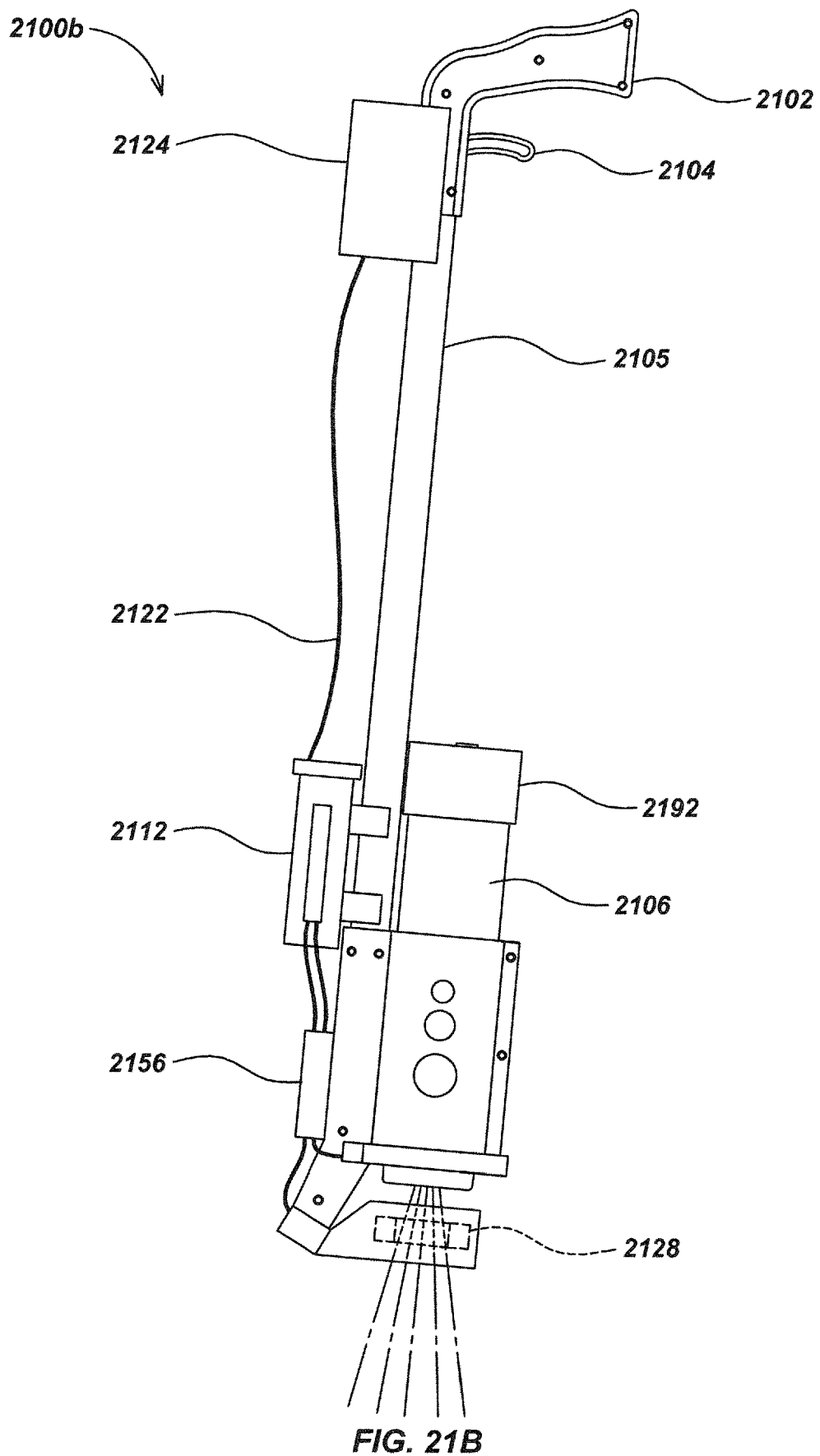
FIG. 21B is a side view of an embodiment of a paint marking stick.

Turning to FIG. 21B, various details of an alternate embodiment paint marking stick 2100*b* in accordance with aspects of the present disclosure are illustrated. The paint stick 2100*b* may include an elongated support structure, such as central shaft 2105. A paint can 2106 may be disposed in a paint can holster or container on the bottom end of the central shaft 2105. A handle 2102, which may include or be coupled to a trigger 2104 and/or a battery (not shown in FIG. 21), may be included in the paint stick 2100*b*, such as by being located at or near a top end of the central shaft 2105.

The paint stick 2100*b* may include sensors or other elements such as compass sensors, inertial navigation sensors, Bluetooth transmitters, and/or RFID transmitters, such as a passive RFID element 2112, as have been described previously herein or are described below.

A color setting selector 2192 may be coupled to the bottom of paint can 2106, which may be used to select or otherwise detect a paint color (from among one or more paint colors), and/or to detect when the paint can 2106 dispenses paint, as illustrated in FIGS. 18A-20B.

Figure 22:
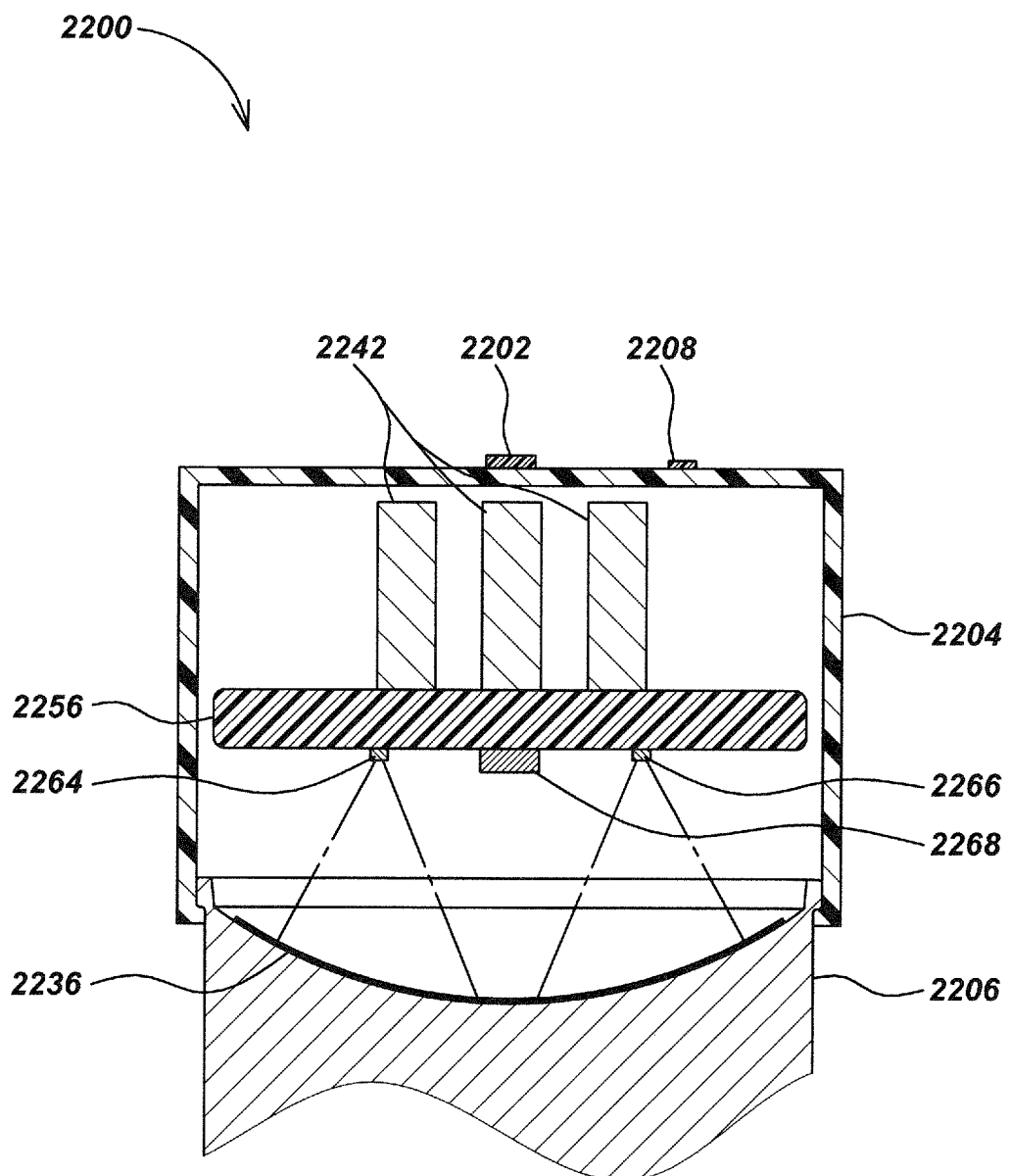
FIG. 22 is a cross-section of an alternate embodiment of a paint can activation and/or color sensing unit.

FIG. 22 is a cross-section of an alternate embodiment of a paint can color setting selector 2200, which may be mounted to the bottom of paint can 2206. Elements, such as an on/off button 2202 and LED status indicator 2208 may be disposed on the outer surface of an enclosure 2204. Sensors or other elements, such as a color sensor 2266, and LED 2264, and a microphone 2268 may be disposed within the enclosure 2204, and below a sonde dipole 2256. A battery element, such as one or more batteries 2242 may be disposed above sonde 2256. The selector 2200 and its components, and the sensor 2266 (and image 2236) may operate similarly to the selector 1900 and sensor 1966 (and image 1936) of FIGS. 19A-B.

FIG. 23 illustrates an embodiment 2300 showing a paint can activation and/or color sensing unit 2340, among other features including a nozzle actuator 2304, a paint can receptacle 2308, a paint can 2306, a nozzle 2338 of the paint can 2306, and a magnet 2334 disposed on the actuator 2304.

Figure 24:
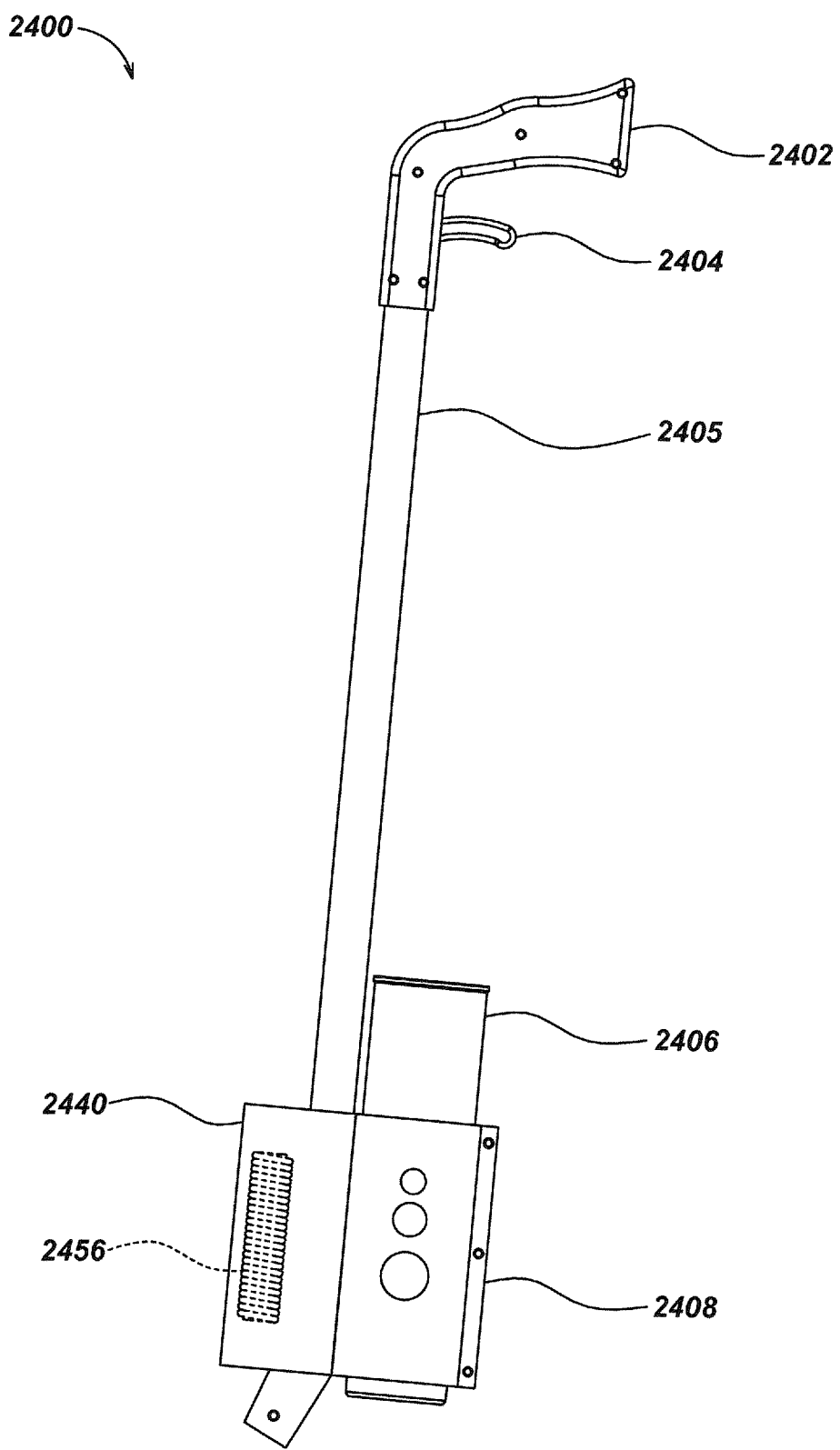
FIG. 24 is a side view of an embodiment of a paint marking stick coupled with a battery powered sonde.

The sensing unit 2340 may house various components, including one or more power sources (e.g., batteries) 2342, a sonde 2356 (which can also be oriented vertically as shown in FIG. 24), an acoustic sensor 2368 configured to sense an acoustic profile of paint dispensing from the paint can 2306 or its nozzle 2338, and a magnetic sensor 2374 that senses movement of the magnet 2334 and thereby senses movement of the nozzle actuator 2304. Although not shown, the unit 2340 may further include a PCB, an RFID or other transmitter, and other components described herein. Certain functions and features of the components shown in FIG. 23 have been described herein in relation to similar components illustrated by other figures and their corresponding description in the Detailed Description.

FIG. 24 provides a side view of an embodiment showing a paint marking stick 2400 that includes a unit 2440 (e.g., similar to the unit 2340 of FIG. 23), a paint can receptacle 2408, a paint can 2406, a handle 2402, a trigger 2404, and an elongated support structure 2405. As shown, the unit 2440 may include a sonde 2456. Certain functions and features of the components shown in FIG. 24 have been described herein in relation to similar components illustrated by other figures and their corresponding description in the Detailed Description.

Figure 25:
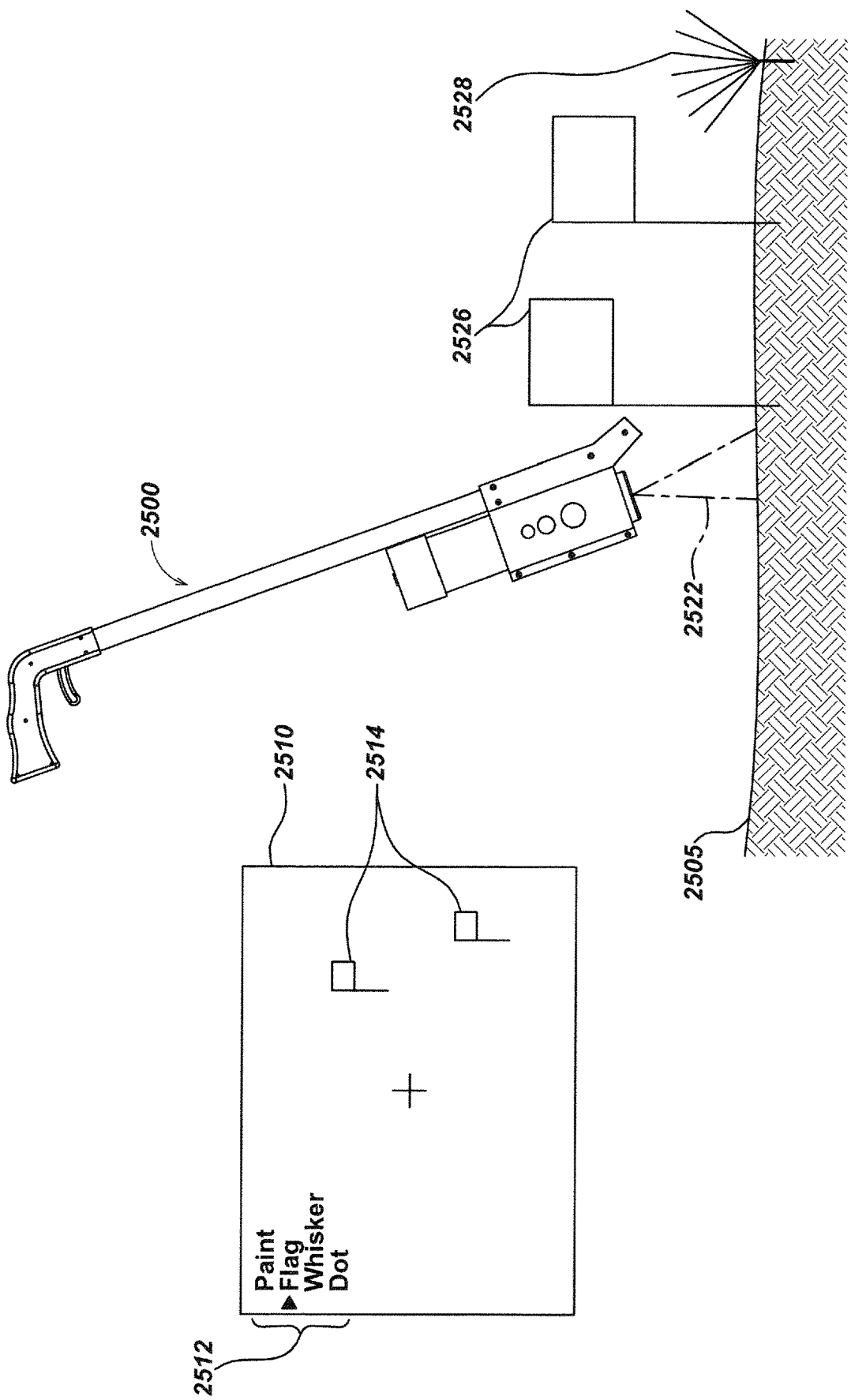
FIG. 25 is a side view of an embodiment of a paint marking stick in use.

FIG. 25 illustrates a side view of a paint marking stick 2500 in use. As shown, the paint stick 2500 may be oriented at a first orientation relative to a vertical orientation that is perpendicular to a surface 2505. Dispensed paint 2522 may be applied to the surface at a first position. Although not shown, the first position of the paint may appear on a screen 2510 of a nearby locator or computing device (e.g., smart phone or tablet). Locations of other markers, including flags 2526 and a whisker 2528, at other positions may be determined (e.g., previously determined or sensed via RFID components coupled to the other markers). Once determined, those other markers may be displayed on the screen 2510. For example, the position of the flags 2526 are shown on the screen 2510 by flag indicators 2514. The screen may indicate different types of markers using marker indicators 2512, which include indications of a line of paint, a flag, a whisker, and a dot, among other indications of other types of markings (not shown). It is further contemplated that, instead of paint, or in addition to paint, RFID markers (e.g., passive RFID transmitters at a micro or nano scale) may be dispensed by the paint stick 250 or other means, and applied to the surface 2505, the flags 2526 or the whisker 2528.

The operator may indicate a type of marking (e.g., flag, whisker, RFID) to capture the location of that type of marking. Various means may be used to achieve that indication, including those described elsewhere herein and other means, including a selector component (e.g., button, slide, dial, touchscreen, speech).

Figure 26:
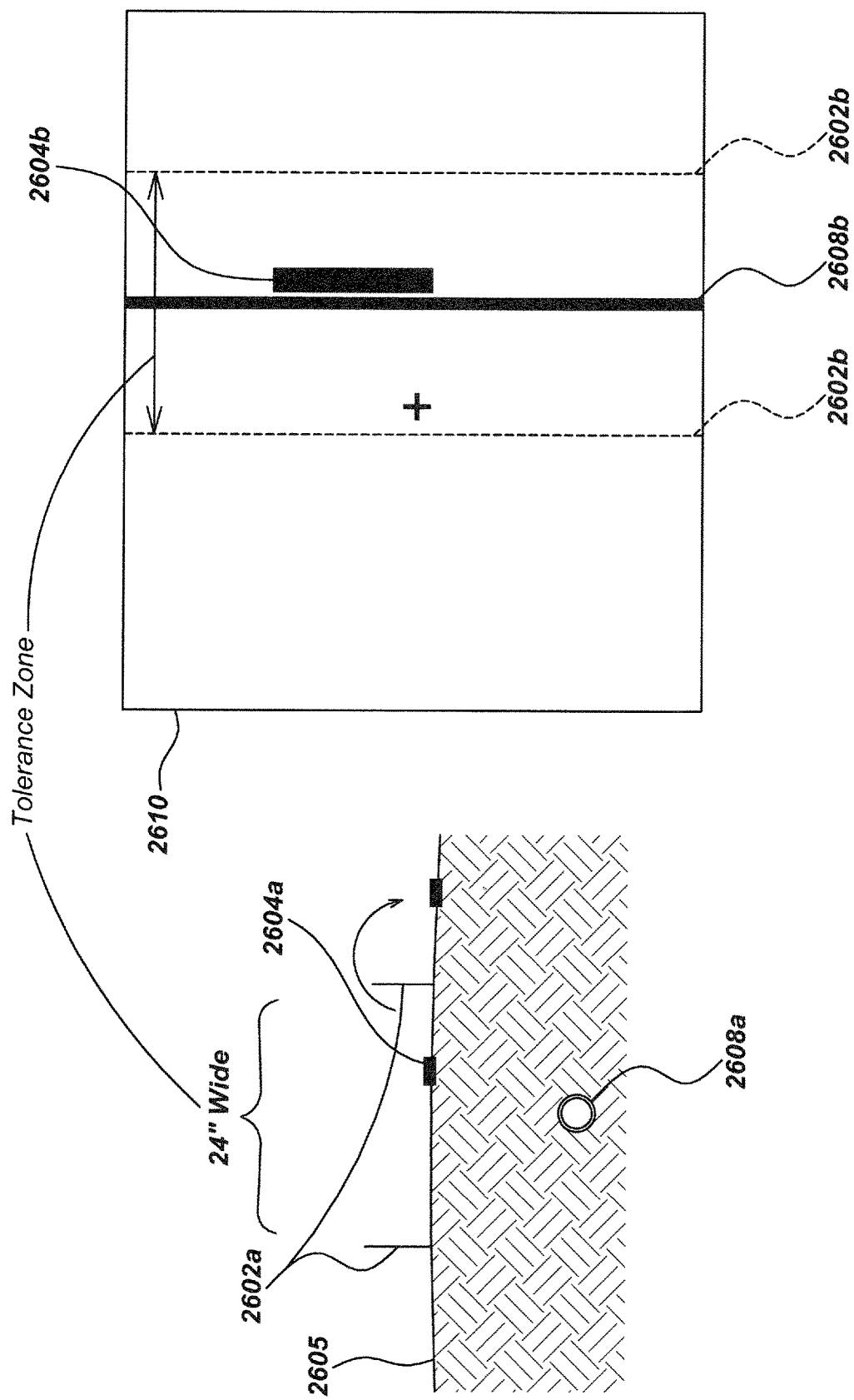
FIG. 26 is a diagram illustrating the tolerance zone for marking utilities.

FIG. 26 illustrates a side view of a location of a tolerance zone 2602*a* for a particular buried object 2608*a* located under a surface 2605 and a marker 2604*a* located on the surface 2605. FIG. 26 further illustrates a screen 2610 of a locator or other device that displays a top view representation 2602*b* of the tolerance zone 2602*a*, a top view representation 2608*b* of the marker 2608*a*, and a top view representation 2604*b* of the marker 2604*a*.

It is contemplated that black rectangles indicated by callout 2604*a* may alternatively represent different locations of a paint stick above the surface 2605 at different times before any marker is applied to the surface 2605. Accordingly, the screen 2610 may display the location of the paint stick as it moves along the surface 2605. The operator may then determine when the location of the paint stick enters the tolerance zone 2602*b* by viewing the top view representation 2602*b* of the tolerance zone 2602*a*. As the paint stick approaches a position on the surface 2605 that is approximately above the location of the buried object 2608*a*, the operator may then activate a paint can of the paint stick (or a geo-marking device) to capture the coverage area 2604*b* of paint from the paint can or movement from the geo-marking device, which corresponds to a movement of the paint stick relative to the surface 2605 and the buried object 2608*a*.

Figure 27:
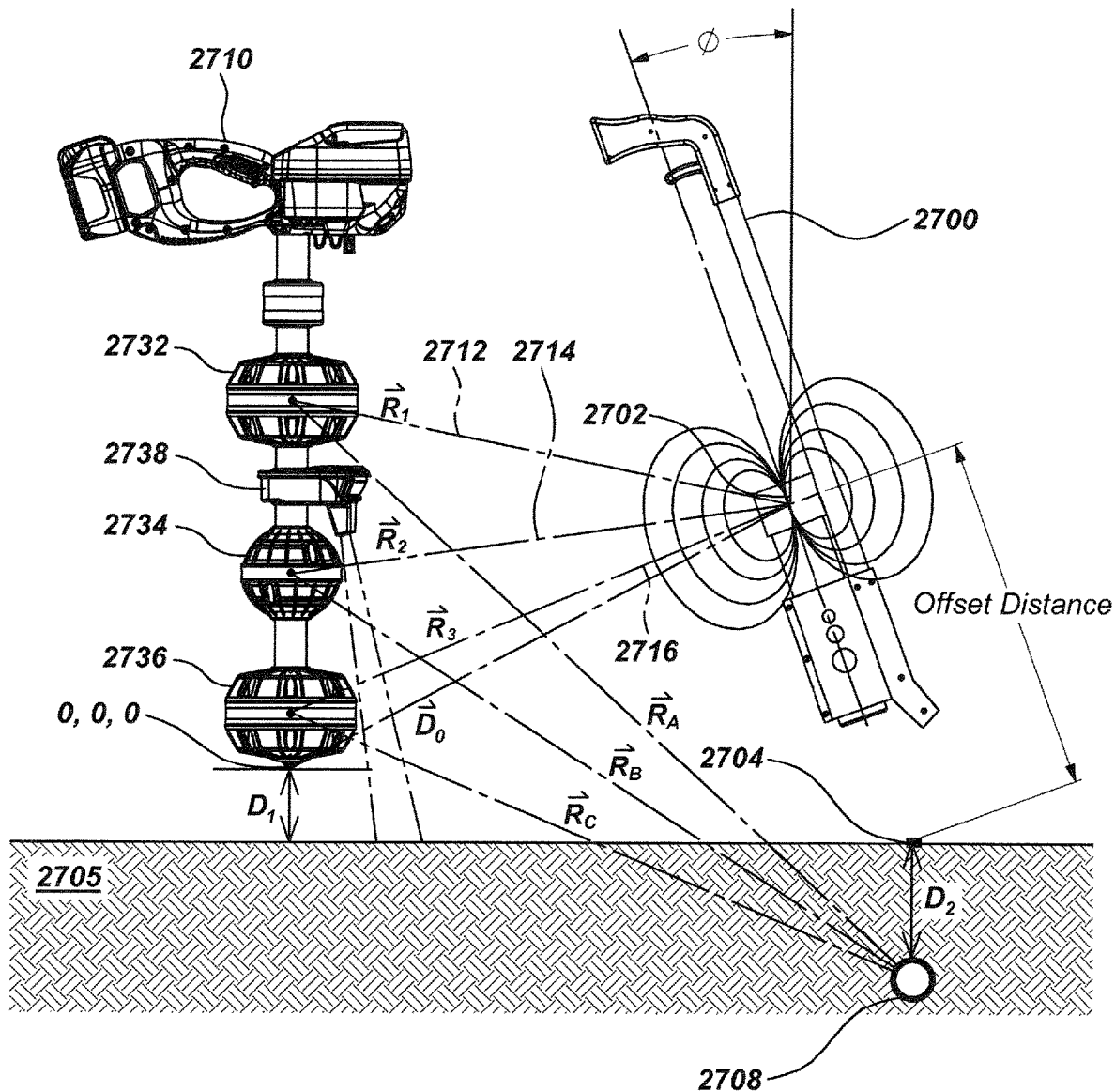
FIG. 27 illustrates a relative position and orientation of a buried utility and a paint marking stick with respect to each other and a locator.

FIG. 27 illustrates a relative position and orientation of a buried utility 2708 and a paint marking stick 2700 with respect to each other and a locator 2710.

A utility locator, such as locator 2710, may include one or more antenna coil nodes, such as upper antenna node 2732, middle antenna node 2734, and lower antenna node 2736. One or more navigational aids, such as a height sensor 2738, a GPS (not shown), a camera or stereo camera pair (not shown), and the like may be disposed on utility locator 2710. Various electronics and firmware may be disposed on locator 2710 to provide a continuous estimation of one or more range vectors $R_1$ 2712, $R_2$ 2714, and $R_3$ 2716 provided by a sonde 2702 disposed on paint marking stick 2700 to the buried utility 2708 located a distance, $D_2$ below the ground 2705. Distance, $D_2$ may be defined as the distance between the surface of the ground 2704 and the buried utility 2708. Such an estimation may aid in calculating a position in a local grid or a universal navigational grid, such as precision latitude-longitude from GPS. Such a calculation may be performed by a Kalman filter, or by statistical techniques such as a least squares fit.

In an exemplary embodiment, the B field may be computed at each of antenna coils 2732, 2734, and 2736. The measured voltage on each channel may be computed by forming the dot product of each coil orientation vector, such as $R_1$ 2712, $R_2$ 2714, and $R_3$ 2716 with the field computed in the previous step, and a residual error versus the measured data may be calculated. Next, a hypothetical dipole source to new positions and moments may be perturbed, and the new residual errors versus the measured data may be calculated. The solution with the worst error attempt may be discarded.

As illustrated by FIGS. 1 & 27, a distance vector from a locator to a paint stick (e.g., a sonde of the paint stick), and a tilt vector of the paint stick may be determined. The distance vector, the tilt vector and a distance from a known position of the locator to a surface may be used to geometrically determine a distance vector along the surface between the locator and an intersection of the tilt vector and the surface to estimate the approximate position of the paint mark. Adjustments in the contour of the surface may be accounted for with knowledge of the terrain, a height sensor in the paint stick, and/or correlation using the tilt and knowledge of the position of the sonde with respect to where the paint dispenses from the paint stick. Further adjustments may be made to account for any tilt of the locator.

One process for approximating the position of a paint marking on a surface may include the follow steps:

First, using a magnetic compass and an accelerometer, the locator's orientation can be found in a three dimensional space (hereunto referred to as "world frame"). The magnetic compass may be configured to find a direction to magnetic north, and the accelerometer may be configured to find the down direction of gravity. The orientation of the locator in the world frame can be expressed in a rotation matrix R.

Second, the voltages on the antenna coils of the locator may be measured to detect the signal from the buried object. Using the voltages, the position and orientation of the buried object can be calculated. Several techniques are available to calculate the position and orientation of the buried object. These techniques depend on the nature of the signal of the buried object. These techniques include iterative searching using Levenberg-Marquardt or the like, or using a closed form solution. This position is in the reference frame of the locator. Using the same orientation calculation, the position of the buried object can be rotated into the world frame using the rotation matrix R.

Third, the height of the locator from the ground can be found with any distance sensor. This height can be used with the position of the buried object to find the depth of the buried object relative to the ground. It is assumed that the plane of the ground is normal to the direction of gravity. Because the locator has an accelerometer, the orientation of this plane is known. Alternatively, adjustments may be made to account for a ground plane that is not normal to the direction of gravity.

Fourth, the position and orientation of a sonde mounted on the paint stick can be uniquely determined relative to the locator using signals on the locator coils induced from the sonde. The sonde has a magnetic axis, which allows for a measurement of the orientation of the paint stick. The sonde on the paint stick serves as a tracking beacon for the paint stick. Like the buried object, the position and orientation of the sonde can be determined using various techniques. The position vector of the paint stick relative to the locator can be called $\vec{x}_{paint,locator}$. The orientation vector of the paint stick can be called $\vec{\theta}_{paint,locator}$. Once again, the orientation and position vectors of the paint stick are rotated into the world frame. The position of the of the paint stick, assuming the locator is the origin, is then: $\vec{x}_{paint} = \vec{x}_{paint,locator}$.

The orientation of the paint stick is: $\vec{\theta}_{paint} = \vec{\theta}_{paint,locator}$.

The tilt of the paint stick (pitch and roll) are included in this orientation vector. The direction of the paint spray is now known.

It is further contemplated that certain characteristics of a marker (e.g., thickness of the marking, design of the marking, color of the marking, pattern of the marking, direction of the marking, and lettering of the marking, among other characteristics) may represent characteristics of a buried object (e.g., depth, orientation, structural integrity, contents, hazards or geological information in the vicinity of the buried object under a surface, among other characteristics).

It is further contemplated that a "virtual" marking can be used in place of the paint marking (e.g., on the ground, flag, whisker, RFID marker), or the type of marking (e.g., flag, whisker, RFID marker). Such virtual markings may be designated by a set of coordinates that relate to a type of marking (e.g., a type of buried object or characteristics of the buried object). Where paint is not applied and, for example, a geo-mark is created for an area associated with a buried object, and an identifier may be associated with the geo-marking. The "virtual" marking could be indicated by actuating some component (e.g., a trigger), or by installing canister that makes a particular sound without dispensing paint.

It is further contemplated that a marking type selector may be used instead of or along with the color selector. For instance, the marking type selector may be used to select a type of mark (e.g., line, dot, flag, whisker, RFID marker), or a type of object associated with the mark (e.g., a communication line, a gas line, a sewer line, geological features, and other characteristics of buried objects).

It is further contemplated that various inputs may be used, including adjustments to mechanical components (e.g., dials, selectors, etc.), touchscreen inputs, speech inputs, motion inputs (e.g., moving the paint stick in a particular manner), and other input means apparent to one of skill in the art.

The various illustrative logical blocks, modules, functions, and circuits described in connection with the embodiments disclosed herein and, for example, in a processing element as described herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration. A processing element may furthering include or be coupled to one or more memory elements for storing instructions, data, and/or other information in a digital storage format.

In some configurations, embodiments of a smart paint stick device include means for performing various functions as described herein. In one aspect, the aforementioned means may be a processor or processors and associated memory in which embodiments reside, and which are configured to perform the functions recited by the aforementioned means. The aforementioned means may be, for example, modules or apparatus residing in a printed circuit board element or modules, or other modules, to perform the functions, methods, and processes as are described herein. In another aspect, the aforementioned means may be a module or apparatus configured to perform the functions recited by the aforementioned means.

In one or more exemplary embodiments, the functions, methods and processes described may be implemented in whole or in part in hardware, software, firmware, or any combination thereof. If implemented in software, the functions may be stored on or encoded as one or more instructions or code on a computer-readable medium. Computer-readable media includes computer storage media. Storage media may be any available media that can be accessed by a computer.

By way of example, and not limitation, such computer-readable media can include RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

It is understood that the specific order or hierarchy of steps or stages in the processes and methods disclosed are examples of exemplary approaches. Based upon design preferences, it is understood that the specific order or hierarchy of steps in the processes may be rearranged while remaining within the scope of the present disclosure. The accompanying method claims present elements of the various steps in a sample order, and are not meant to be limited to the specific order or hierarchy presented.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the disclosure.

The various illustrative logical blocks, modules, processes, methods, and/or circuits described in connection with the embodiments disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps or stages of a method, process or algorithm described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

The claims are not intended to be limited to the aspects shown herein, but is to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover: a; b; c; a and b; a and c; b and c; and a, b and c.

It is noted that as used herein that the terms "component" or "unit" or other singular terms may refer to two or more of those members. For example, a "component" may comprise multiple components, and a "unit" may comprise multiple units or components. Moreover, the terms "component" or "unit" or other descriptive terms may be used to describe a general feature or function of a group of components, units or other things. For example, an "RFID unit" may refer to the primary function of the unit, but the physical unit may include non-RFID components, sub-units, and such.

The previous description of the disclosed aspects is provided to enable any person skilled in the art to make or use the present disclosure. Various modifications to these aspects will be readily apparent to those skilled in the art, and the generic principles defined herein may be applied to other aspects without departing from the spirit or scope of the disclosure. Thus, the disclosure is not intended to be limited to the aspects shown herein but is to be accorded the widest scope consistent with the principles and novel features disclosed herein.

The invention claimed is:

1. A system for locating buried objects, the system comprising:
    a buried object locator comprising:
        a first wireless communication component; and
        a tracking component configured to detect a location of a buried object; and
    a paint stick configured to cause a paint container to dispense paint at a first position associated with the location of the buried object, wherein the paint stick comprises:
        a second wireless communication component configured to communicate with the first communication component of the locator;
        a position determination component configured to transmit one or more range vector signals, wherein the tracking component is further configured to detect the one or more range vector signals;
        a processing component configured to determine the first position based on the detected range vector signals; and
        a position device to determine a second position of the locator, wherein the processing component is further configured to determine the first position based on the second position determined by the position device.

2. The system of claim 1, wherein the second communication component and the position determination component are collectively a sonde dipole.

3. The system of claim 1, wherein the processing component is further operable to determine a distance between the buried object locator and the paint stick in three-dimensional space based on the one or more range vector signals, and to determine the first position based on the distance.

4. The system of claim 1, wherein the paint stick further comprises:
    an inertial sensor configured to determine a first tilt angle of the paint stick in three-dimensional space,
    wherein the first communication component is configured to receive information specifying the first tilt angle, and
    wherein the processing component is further operable to determine the first position based on the detected range vector signals and the first tilt angle.

5. The system of claim 1, wherein the position determination component includes at least one sonde, and the tracking component includes at least one electromagnetic sensor.

6. The system of claim 1, further comprising:
    a screen configured to display information relating to the first position of the dispensed paint.

7. The system of claim 6, wherein the screen is configured to display the first position of and a tolerance zone associated with the buried object.

8. The system of claim 6, further comprising:
    a processor operable to identify a first type of buried object associated with a detected color of the dispensed paint, and further operable to identify a second type of buried object associated with the buried object, wherein the screen is configured to display an indication that the first type and the second type do not match.

9. The system of claim 6, wherein the screen is configured to indicate a type of marking associated with the first position from among types of markings selected from the group consisting of a flag attached to a surface, a whisker positioned on or above the surface, and an RFID marker disposed under, on or above the surface.

10. The system of claim 1, further comprising:
    a detection component configured to detect when the paint container dispenses the paint at the first position.

11. The system of claim 10, wherein the position determination component is configured to transmit the one or more range vector signals upon detection, by the detection component, that the paint container is dispensing the paint, wherein the second communication component is configured to transmit, to the first communication component, an indication that the paint container is dispensing paint.

12. The system of claim 10, wherein the detection component comprises:
    an acoustic sensor configured to detect when the paint container dispenses the paint by identifying a first frequency, from among other frequencies, associated with a sound of the paint dispensing from the paint container.

13. The system of claim 12, wherein the paint container includes an exit nozzle, wherein the paint exits via the exit nozzle when applied to the first position, and wherein the acoustic sensor is located closer to the exit nozzle than a base of the paint container.

14. The system of claim 1, wherein at least one of the first wireless communication component and the second wireless communication component comprise one or more of ISM (Industrial, Scientific and Medical) radio devices or modules, licensed spectrum radio devices or modules, passive and active RFID (Radio Frequency Identification) transmitters, Bluetooth or Wi-Fi modules, cellular devices or modules, and GPS (Global Positioning System) devices.

* * * * *